United States Patent
Barai

(10) Patent No.: US 8,464,193 B1
(45) Date of Patent: Jun. 11, 2013

(54) OPTICAL PROXIMITY CORRECTION (OPC) METHODOLOGY EMPLOYING MULTIPLE OPC PROGRAMS

(75) Inventor: Samit Barai, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/474,752

(22) Filed: May 18, 2012

(51) Int. Cl.
*G06F 17/50* (2006.01)

(52) U.S. Cl.
USPC ......................................... 716/110

(58) Field of Classification Search
USPC ................................. 716/100, 110
See application file for complete search history.

(56) References Cited

U.S. PATENT DOCUMENTS

| | | | |
|---|---|---|---|
| 6,795,952 B1 * | 9/2004 | Stine et al. | 716/56 |
| 6,839,125 B2 | 1/2005 | Hansen | |
| 7,111,277 B2 | 9/2006 | Ye et al. | |
| 7,642,020 B2 | 1/2010 | Han et al. | |
| 7,747,978 B2 | 6/2010 | Ye et al. | |
| 7,760,347 B2 | 7/2010 | Nehmadi et al. | |
| 7,765,021 B2 | 7/2010 | Mansfield et al. | |
| 7,860,701 B2 * | 12/2010 | Graur et al. | 703/14 |
| 2007/0032896 A1 | 2/2007 | Ye et al. | |
| 2007/0117030 A1 | 5/2007 | Laidig et al. | |
| 2008/0071512 A1 * | 3/2008 | Graur et al. | 703/14 |
| 2009/0157360 A1 | 6/2009 | Ye et al. | |
| 2010/0162197 A1 | 6/2010 | Ye et al. | |
| 2010/0180251 A1 | 7/2010 | Ye et al. | |
| 2010/0229147 A1 | 9/2010 | Ye et al. | |
| 2011/0070531 A1 * | 3/2011 | Iyanagi | 430/5 |
| 2011/0099526 A1 | 4/2011 | Liu | |
| 2011/0286656 A1 * | 11/2011 | Kulkarni et al. | 382/144 |

OTHER PUBLICATIONS

Top, M.K. et al., "OPC Model Error Study Through Mask and SEM Measurement Error" Metrology, Inspection, and Process Control for Microlithography XXIV, Proceedings of the SPIE (Mar. 8, 2010) pp. 76381Y-76381Y-7, vol. 7638.
Borjon, A. et al., "High Accuracy 65nm OPC Verification: Full Process Window Model vs. Critical Failure ORC" Proceedings of the SPIE (Mar. 1, 2005) pp. 1190-1201, vol. 5754.

* cited by examiner

*Primary Examiner* — Suchin Parihar
(74) *Attorney, Agent, or Firm* — Scully, Scott, Murphy & Presser, P.C.; Yuanmin Cai

(57) ABSTRACT

A marker layer is placed in regions of a design layout in which an image slope is less than a critical image slope or a perimeter to area ratio is less than a critical perimeter to area ratio. Multiple optical proximity correction (OPC) can be generated by grouping subsets of process conditions at which error mean and/or error root-mean-square (RMS) exceed threshold values. Regions marked with the marker layer are processed with a rigorous OPC employing at least one non-standard resist model, while unmarked regions of the layout are processes with a standard OPC program that is less rigorous than the at least one non-standard resist model. Additionally, number of edges and areal image contrast can be compared among layout clips to determine threshold values for the number of edges and the areal image contrast, which can be employed to determine if multiple OPC is needed for each layout clip.

24 Claims, 13 Drawing Sheets

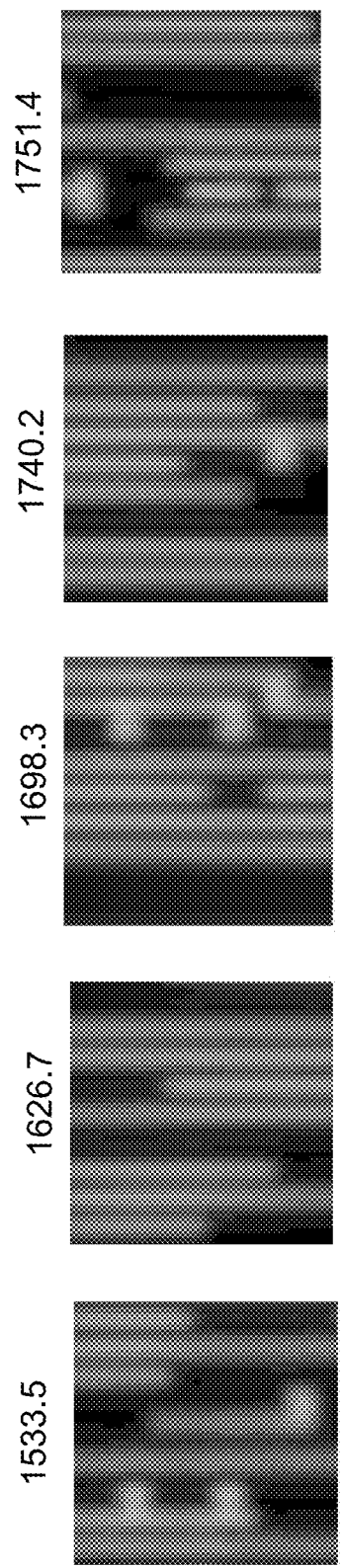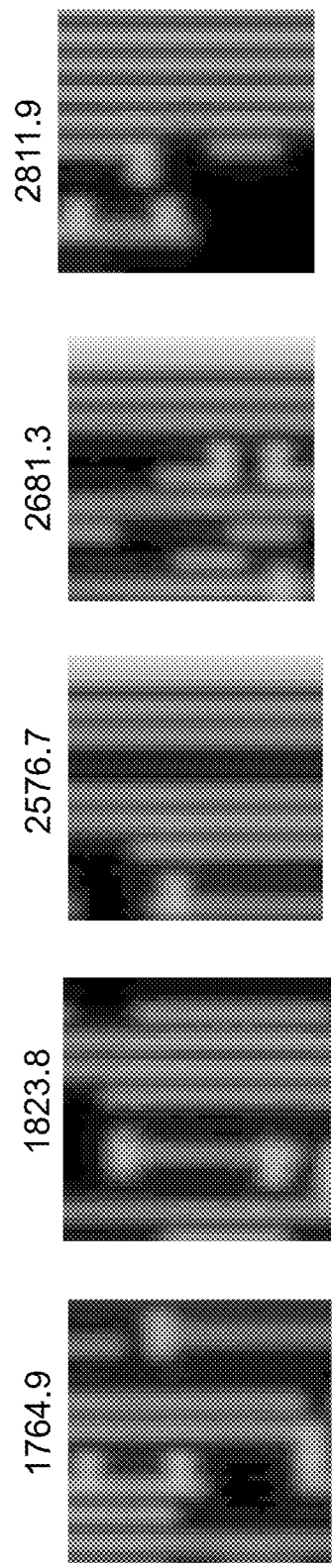
FIG. 10A  FIG. 10B  FIG. 10C  FIG. 10D  FIG. 10E
FIG. 10F  FIG. 10G  FIG. 10H  FIG. 10I  FIG. 10J

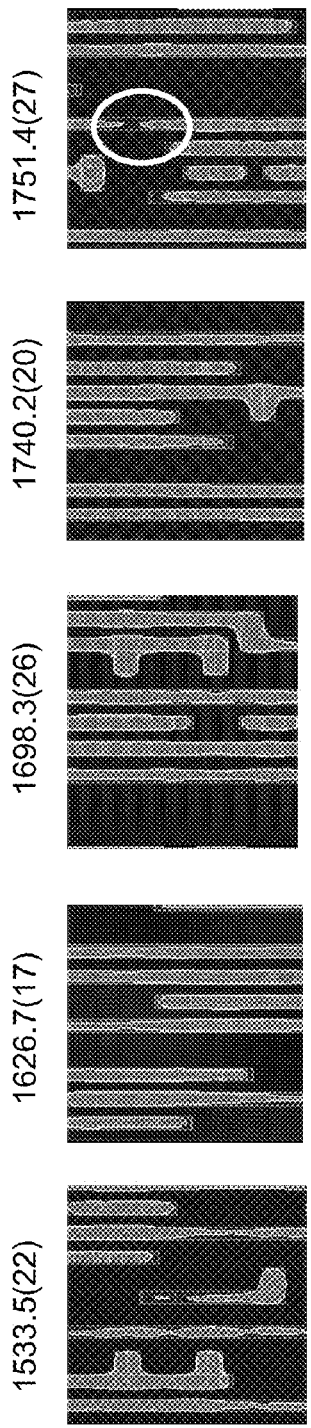
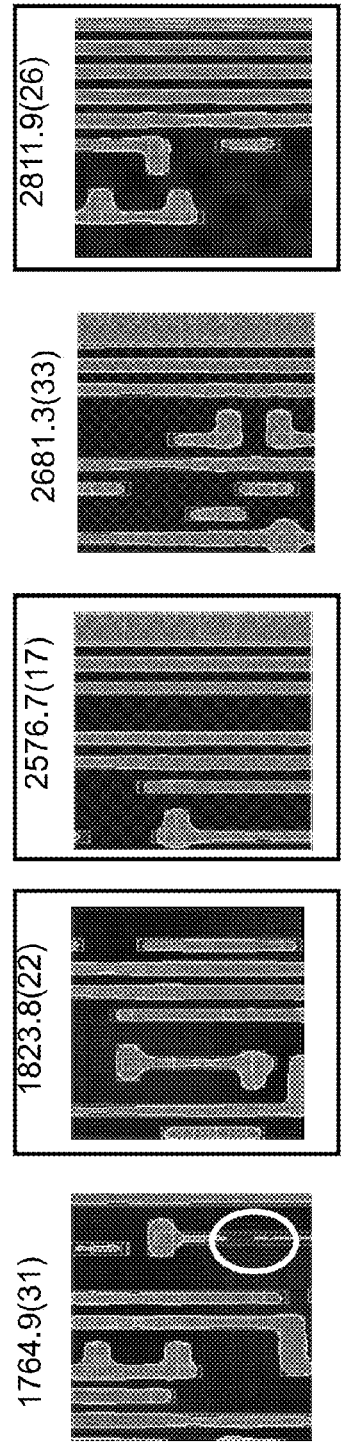

OPTICAL PROXIMITY CORRECTION (OPC) METHODOLOGY EMPLOYING MULTIPLE OPC PROGRAMS

BACKGROUND

The present disclosure relates to a methodology for optical proximity correction (OPC) that employs multiple OPC programs based on multiple process models and a system for implementing the same.

OPC is employed to enable printing of lithographic shapes affected by the wave nature of irradiating light in lithographic processes. OPC is particularly useful when the lithographic shapes to be printed include sublithographic features, i.e., features having a dimension less than a minimum printable hole, line, or spacer.

OPC methodology as known in the art typically employs a single OPC program employing a same set of parameters for the entire design layout. The set of parameters in an OPC program includes, for example, fragments and number of iterations. Further, OPC methodology as known in the art employs a single process model that is applied to the entirety of a design layout. The single process model includes a single resist model.

Thus, the OPC methodology as known in the art employs the same OPC program irrespective of the sensitivity of various patterns within a design layout. Further, because resist development characteristics and cross-sectional shapes are different at different process conditions corresponding to a different set of lithographic does and depth of focus, a single process model employing a single resist model does not represent the entire range of process variations.

BRIEF SUMMARY

A marker layer is placed in regions of a design layout in which an image slope is less than a critical image slope or a perimeter to area ratio is less than a critical perimeter to area ratio. Multiple optical proximity correction (OPC) including multiple resist models can be generated by grouping subsets of process conditions at which error mean and/or error root-mean-square (RMS) exceed threshold values. Regions marked with the marker layer are processed with a rigorous OPC employing at least one non-standard resist model, while unmarked regions of the layout are processes with a standard OPC program that is less rigorous than the at least one non-standard resist model. Additionally, number of edges and areal image contrast can be compared among layout clips to determine threshold values for the number of edges and the areal image contrast, which can be employed to determine if multiple OPC is needed for each layout clip.

According to an aspect of the present disclosure, a method of performing optical proximity correction on a design layout is provided. The method includes: generating at least one design clip from the design layout, wherein each of the at least one design clip includes a subset of the design layout; assigning at least one measurement site to each of the at least one design clip; determining, for each selected design clip among the at least one design clip, whether the selected design clip satisfies a predetermined criterion for classifying the selected design clip as including at least one complex design feature; marking, for each selected design clip that is identified as satisfying the predetermined criterion, a region that satisfies the predetermined criterion with a marker layer; and performing OPC on regions not marked with the marker layer with an OPC program and performing OPC on regions marked with the marker layer with at least another OPC program different from the OPC program.

According to another aspect of the present disclosure, a method of performing optical proximity correction on a design layout is provided. The method includes: generating a map of a perimeter to area ratio for the design layout; sorting a plurality of design clips from the design layout into a plurality of bins, wherein each bin includes a non-overlapping range of values for the perimeter to area ratio; determining, for each bin selected from the plurality of bins, a threshold value for each of at least one layout complexity parameter for design clips within the selected bin, wherein the threshold value characterizes design clips in which bridging or pinching of design shapes is marginally absent; classifying, for each selected bin, design clips into first design clips that has, for each of the at least one layout complexity parameter, a value that represents less complexity than a corresponding threshold value, and into second design clips that include all other design clips than the first design clips; and performing OPC on the first design clips with a first OPC program and performing OPC on the second design clips with at least one second OPC program different from the OPC program.

According to yet another aspect of the present disclosure, a method of identifying regions having different levels of design complexity is provided. The method includes: generating at least one design clip from the design layout, wherein each of the at least one design clip includes a subset of the design layout; assigning at least one measurement site to each of the at least one design clip; determining, for each selected design clip among the at least one design clip, whether the selected design clip satisfies a predetermined criterion, the predetermined criterion including at least one of whether the selected design clip has a perimeter to area ratio that is greater than a predefined critical perimeter to area ratio and whether the selected design clip includes a measurement site at which an areal image slope is less than a predefined critical areal image slope; marking, for each selected design clip that satisfies the criterion, each region that satisfies the predetermined criterion with a marker layer; classifying regions marked with the marker layer as a first set of regions, and regions not marked with the marker layer as a second set of regions; and storing data identifying at least one of the first set of regions and the second set of regions in a non-transitory machine-readable data storage medium.

According to even another aspect of the present disclosure, a system for performing optical proximity correction on a design layout is provided. The system includes a computing means and a non-transitory machine-readable data storage medium. The computing means includes a processor and a memory that are configured to run a automated program including steps of: generating at least one design clip from the design layout, wherein each of the at least one design clip includes a subset of the design layout; assigning at least one measurement site to each of the at least one design clip; determining, for each selected design clip among the at least one design clip, whether the selected design clip satisfies a predetermined criterion for classifying the selected design clip as including at least one complex design feature; marking, for each selected design clip that is identified as satisfying the predetermined criterion, a region that satisfies the predetermined criterion with a marker layer; performing OPC on regions not marked with the marker layer with an OPC program and performing OPC on regions marked with the marker layer with at least another OPC program different from the OPC program; and storing data representing results of the performance of OPC with the OPC program and the performance of OPC with the at least another OPC program in the non-transitory machine-readable data storage medium.

According to still another aspect of the present disclosure, a system for performing optical proximity correction on a design layout is provided. The system includes a computing means and a non-transitory machine-readable data storage medium. The computing means includes a processor and a memory that are configured to run a automated program including steps of: generating a map of a perimeter to area ratio for the design layout; sorting a plurality of design clips from the design layout into a plurality of bins, wherein each bin includes a non-overlapping range of values for the perimeter to area ratio; determining, for each bin selected from the plurality of bins, a threshold value for each of at least one layout complexity parameter for design clips within the selected bin, wherein the threshold value characterizes design clips in which bridging or pinching of design shapes is marginally absent; and classifying, for each selected bin, design clips into first design clips that has, for each of the at least one layout complexity parameter, a value that represents less complexity than a corresponding threshold value, and into second design clips that include all other design clips than the first design clips; performing OPC on the first design clips with a first OPC program and performing OPC on the second design clips with at least one second OPC program different from the OPC program; and storing data representing results of the performance of OPC with the OPC program and the performance of OPC with the at least another OPC program in the non-transitory machine-readable data storage medium.

BRIEF DESCRIPTION OF THE SEVERAL VIEWS OF THE DRAWINGS

FIGS. 10A-10J are various examples of simulated areal images of design clips according to an embodiment of the present disclosure.

FIGS. 11A-11J are the various examples of design clips of FIGS. 9A-9J, respectively, along with areal image contrast and number of edges within each design layout annotated at the top of each corresponding design clip according to an embodiment of the present disclosure.

DETAILED DESCRIPTION

Figure 1:
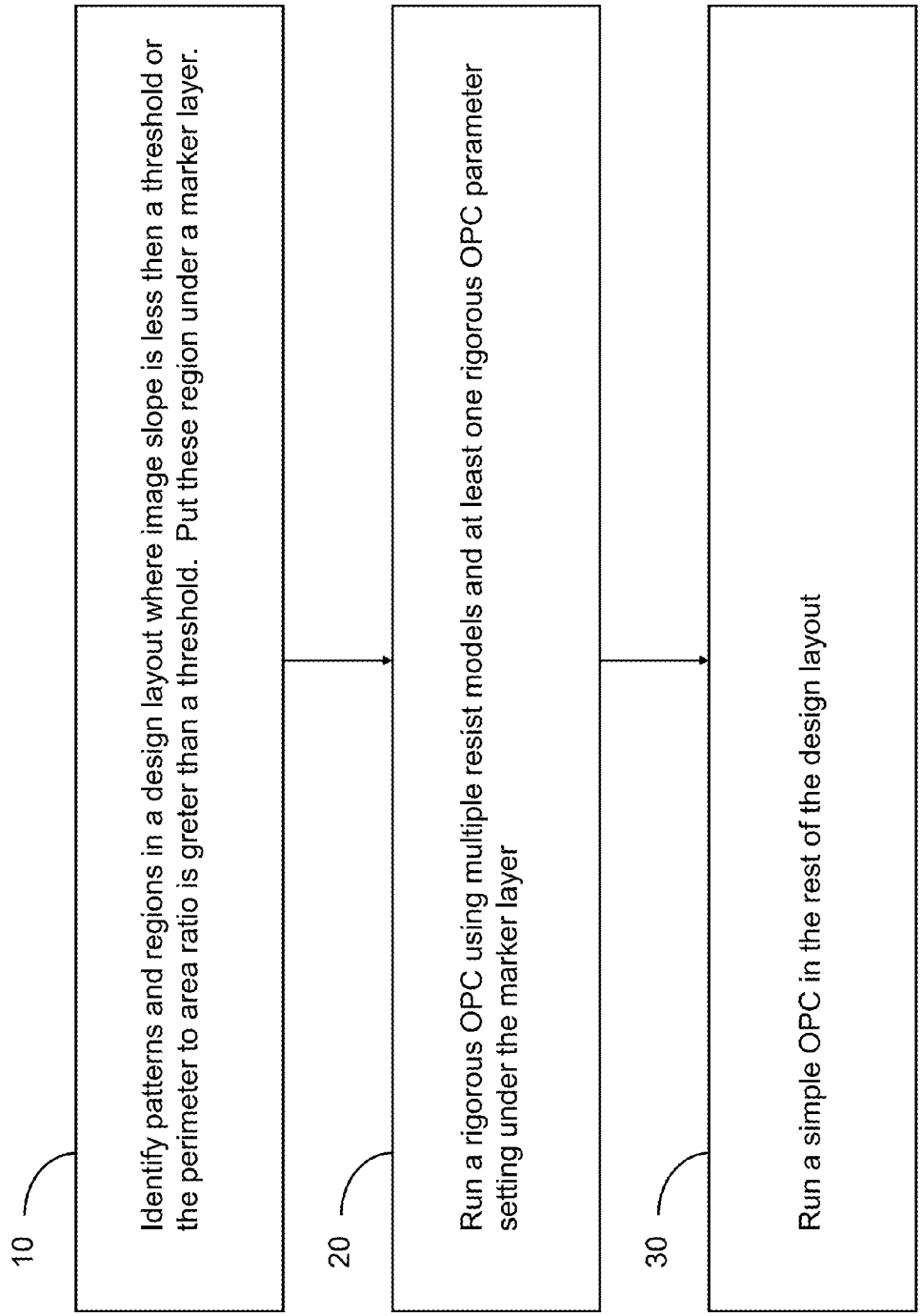
FIG. 1 is a flow chart illustrating a method of applying multiple OPC programs to a design layout according to an embodiment of the present disclosure.

As stated above, the present disclosure relates to a methodology for optical proximity correction (OPC) that employs multiple OPC programs based on multiple process models and a system for implementing the same, which is now described in detail with accompanying figures. Like and corresponding elements mentioned herein and illustrated in the drawings are referred to by like reference numerals. The drawings are not necessarily drawn to scale.

As used herein, a "design clip" refers to a subset of a design layout for a semiconductor chip that is less than the entirety of the design layout.

As used herein, a "lithography process model" or a "process model" is a set of equations that are numerically computed, using an optical model first, to extract the light intensity distribution that is produced on the wafer surface by the imaging of the diffraction that results from a lithographic mask that is illuminated with a monochromatic light and via a system of lenses and/or mirrors, and using a photoresist model second, to compute, from that image intensity distribution, a remaining photoresist topography after a photoresist material chemically reacts to the image light intensity above a certain threshold to become soluble or insoluble, depending on photoresist polarity, to a developer solution, and is subsequently washed with said developer solution.

As used herein, an "optical model" refers to a model within a lithography process model and contains a set of equations that describe the illumination and diffraction from a lithographic mask, and the propagation and imaging onto the photoresist film of said diffracted light through the lithographic scanner system of lenses.

An optical model computes the intensity distribution of the aerial image at the wafer plane. The computation of the intensity distribution of the aerial image at the wafer plane can be effected by employing the shapes on a lithographic mask, the configuration of the illuminating source, and other parameters of the optical lens system which are fixed from the stepper/scanner.

As used herein, a "main feature model," a "main feature process model," a "main feature lithography process model," an "optical proximity correction model," or an "OPC model" refers to a lithography process model that predicts photoresist contours corresponding to the presence of main features within a layout of a lithographic mask.

A main feature model predicts the photoresist contours at a single plane or height of the photoresist topography as seen from a top-down view. A main feature model can be used in full-chip compatible optical proximity correction algorithms. A main feature model can be compatible with simulations at a full-chip scale. A main feature model can be calibrated to, and aim to, predict the photoresist contours due to resolvable features of the layout.

As used herein, "optical model parameters" refer to parameters in an optical model. The computation of the image intensity inside a photoresist layer requires information on the location of the best focus plane. In addition, in order to compute critical dimension values or photoresist contours, the simulator needs to know at which height in the photoresist layer to compute a two-dimensional image, i.e., which horizontal plane is to be employed as the image plane.

As used herein, a "photoresist model" or a "resist model" refers to the equation or set of equations describing the final photoresist topography contours after exposure by the image and development with a developer solution in any lithography process model.

A photoresist model predicts a physical structure of a photoresist. A photoresist model is derived from a physical, mechanistic description of the chemical response of a photoresist to exposure and development processes. In one embodiment of the present disclosure, the photoresist model can be employed to perform operations with a set of pre-defined basis functions on an aerial image, which is taken as an input for the photoresist model. These basis functions can use parameters that have been previously calibrated. Each operation can be, for instance, in the form of performing the convolution between the aerial image and a Gaussian function at every point of the aerial image, where the standard variation of the Gaussian function has been previously determined during calibration. After that, all the results from said operations are combined together according to a predefined polynomial equation. Each term of this polynomial is the result of one of the operations performed on the aerial image with those basis functions, multiplied by a coefficient that has also been previously calibrated. The final result of applying this polynomial to the aerial image is a set of contours representing the top-down view of the developed photoresist topography.

As used herein, a "depth of focus" or a "focus" refers to the height of a wafer stage during lithographic exposure. A focus can be defined relative to the plane of best focus plane, which is the height of the wafer stage in the scanner at which the image and, therefore photoresist contours, are sharpest.

As used herein, a "dose" refers to the amount of energy exposed over a photoresist layer on a wafer, with energy being a function of the exposure time (i.e., energy=intensity×time). A dose can be defined relative to the value of a best dose, at which the photoresist line-widths are equal to the target line-width value.

A lithographic process can be characterized by a combination of a focus and a dose. This combination is also referred to as "focus and dose conditions," "exposure focus and dose conditions," or "lithographic exposure and dose conditions."

As used herein, "nominal dose and focus conditions" refer to the combination of a nominal dose and a nominal focus that is known to be optimal for the purpose of replicating intended patterns from a lithographic mask on a photoresist layer.

As used herein, an "areal image contrast" can be defined as the average of the sum of the squares of the difference between the intensity at each pixel and the areal average of the intensity within a design clip. The calculation of the difference and the calculation of the average are performed at each pixel within the design clip. In other words, the contrast is given by:

$$\frac{\sum_{all\ pixels} \{I(x,y) - \text{ave}[I(x,y)]\}^2}{\text{total number of pixels}},$$

in which I(x, y) is the intensity function of the design clip as generated by an optical model, and ave(I(x,y)) is the mathematical average of the intensity function taken over the design clip.

As used herein, a "bridging" refers to merging of two distinct and disjoined design shapes into a single shape in a simulation for a developed image.

As used herein, a "pinching" refers to disjoining of a thin section of a single design shape into two disjoined shapes in a simulation for a developed image.

As used herein, a feature such as a bridging or a pinching is "marginally absent" if the feature is absent but can be reproduced by an infinitesimal change in a process parameter. For example, in a photoresist development process or an etch process, a transition phase can exist where the process begins to fail in reproducing a feature, i.e., in resolving patterns as originally intended. In this case, the feature that is not reproduced, but can be reproduced with an infinitesimal change of a process parameter, is referred to be marginally absent. The process behavior is highly non-linear in the transition phase and models tend to become inaccurate in the transition phase.

As used herein, a "unit grid dimension" is the unit dimension of a grid employed to design.

Referring to FIG. 1, a flow chart illustrates a method of applying multiple optical proximity correction programs to a design layout according to an embodiment of the present disclosure. Referring to step 10, patterns and/or regions in a design layout are identified in which a criterion is met. The criterion is a logical "OR" combination of a first condition that image slope is less than a threshold value for the image slope and a second condition that a perimeter to area ratio is greater than a threshold value for the perimeter to area ratio. Regions that meet the criterion and/or regions including patterns that meet the criterion are marked with a marker layer.

Figure 2:
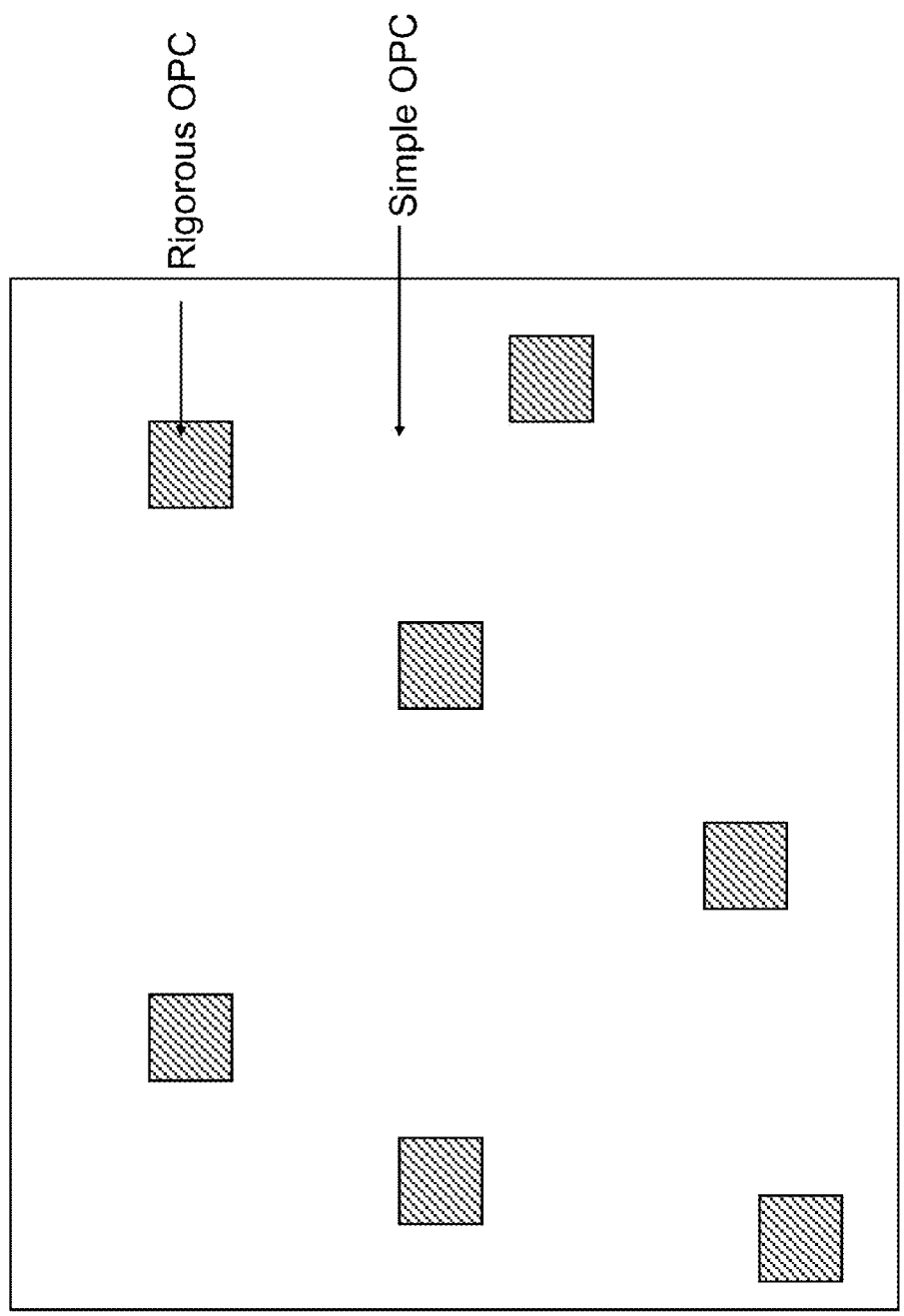
FIG. 2 is a schematic diagram illustrating an exemplary set of regions marked with a marker layer according to an embodiment of the present disclosure.

Referring to FIG. 2, a schematic diagram illustrates an exemplary set of regions marked with a marker layer (hatched regions). Different optical proximity correction (OPC) programs are subsequently run for regions marked with the marker layer than for regions that are not marked with the marker layer. Specifically, a rigorous OPC program that provides a more extensive and calculation-intensive correction is applied to the regions marked with the marker layer, while a simple OPC program that provides a less extensive and calculation-efficient correction is applied to the regions that are not marked with the marker layer.

Referring to step 20 of FIG. 1, a rigorous OPC, i.e., an OPC employing a more extensive evaluation of the process window for a lithographic exposure and development process, is employed to provide OPC to the features under the marker layer in the design layout. The rigorous OPC can employ multiple resist models and at least one rigorous OPC parameter, i.e., smaller fragments (a unit area for applying an OPC correction in a design layout) and/or an increased number of iterations for an OPC run.

Referring to step 30, a simple OPC program is run in the rest of the design layout, i.e., in the portions of the design layout that are not covered by the marker layer. The simple OPC can employ a single resist model and a standard set of OPC parameters, i.e., standard size fragments and a standard number of iterations for an OPC run. In one embodiment, the simple OPC can employ a relaxed set of OPC parameters, i.e., larger size fragments and a reduced number of iterations for an OPC run.

The method illustrated in FIG. 1 can be employed to identify regions having different levels of design complexity. Further, the method illustrated in FIG. 1 can be employed to perform optical proximity correction on a design layout employing multiple OPC programs that correspond to different levels of design complexity.

In one embodiment, the method of FIG. 1 can be implemented by performing a series of steps, either manually or by employing an automated system including a computing means and a non-transitory machine-readable data storage medium in which the computing means includes a processor and a memory that are configured to run a automated program.

The series of steps that can be employed to identify regions having different levels of design complexity can include, for example, a step of generating at least one design clip from the design layout such that each of the at least one design clip includes a subset of the design layout, a step of assigning at least one measurement site to each of the at least one design clip, a step of determining, for each selected design clip among the at least one design clip, whether the selected design clip satisfies a predetermined criterion, the predetermined criterion including at least one of whether the selected design clip has a perimeter to area ratio that is greater than a predefined critical perimeter to area ratio and whether the selected design clip includes a measurement site at which an areal image slope is less than a predefined critical areal image slope, a step of marking, for each selected design clip that satisfies the criterion, each region that satisfies the predetermined condition with a marker layer, a step of classifying regions marked with the marker layer as a first set of regions, and regions not marked with the marker layer as a second set of regions, and a step of storing data identifying at least one of the first set of regions and the second set of regions in a non-transitory machine-readable data storage medium.

The series of steps that can be employed to perform optical proximity correction on a design layout employing multiple OPC programs that correspond to different levels of design complexity can include, for example, a step of generating at least one design clip from the design layout such that each of the at least one design clip includes a subset of the design layout, a step of assigning at least one measurement site to each of the at least one design clip, a step of determining, for each selected design clip among the at least one design clip, whether the selected design clip satisfies a predetermined criterion for classifying the selected design clip as including at least one complex design feature, a step of marking, for each selected design clip that is identified as satisfying the predetermined condition, a region that satisfies the predetermined condition with a marker layer, and a step of performing OPC on regions not marked with the marker layer with an OPC program and performing OPC on regions marked with the marker layer with at least another OPC program different from the OPC program.

The generation of at least one design clip from the design layout such that each of the at least one design clip includes a subset of the design layout can be effected, for example, by dividing the design layout into multiple design clips. The size of each design clip can be determined based on convenience, the capabilities of an analysis program to analyze each design clip, and/or the capabilities of the computing means to run the analysis program. In one embodiment, the design layout can be divided into design layouts of equal size. In another embodiment, the design layout can be divided into design layouts such that each design layout includes approximately the same number of design features (e.g., edges, corners, distinct shapes, etc.) Any other method of dividing the design layout into design clips can also be employed.

One of the parameters employed in embodiments of the present disclosure is an areal image slope. The areal image slope is the magnitude of the two-dimensional gradient of areal image intensity that is measured for a simulated intensity distribution corresponding to a design clip.

Figure 3A:
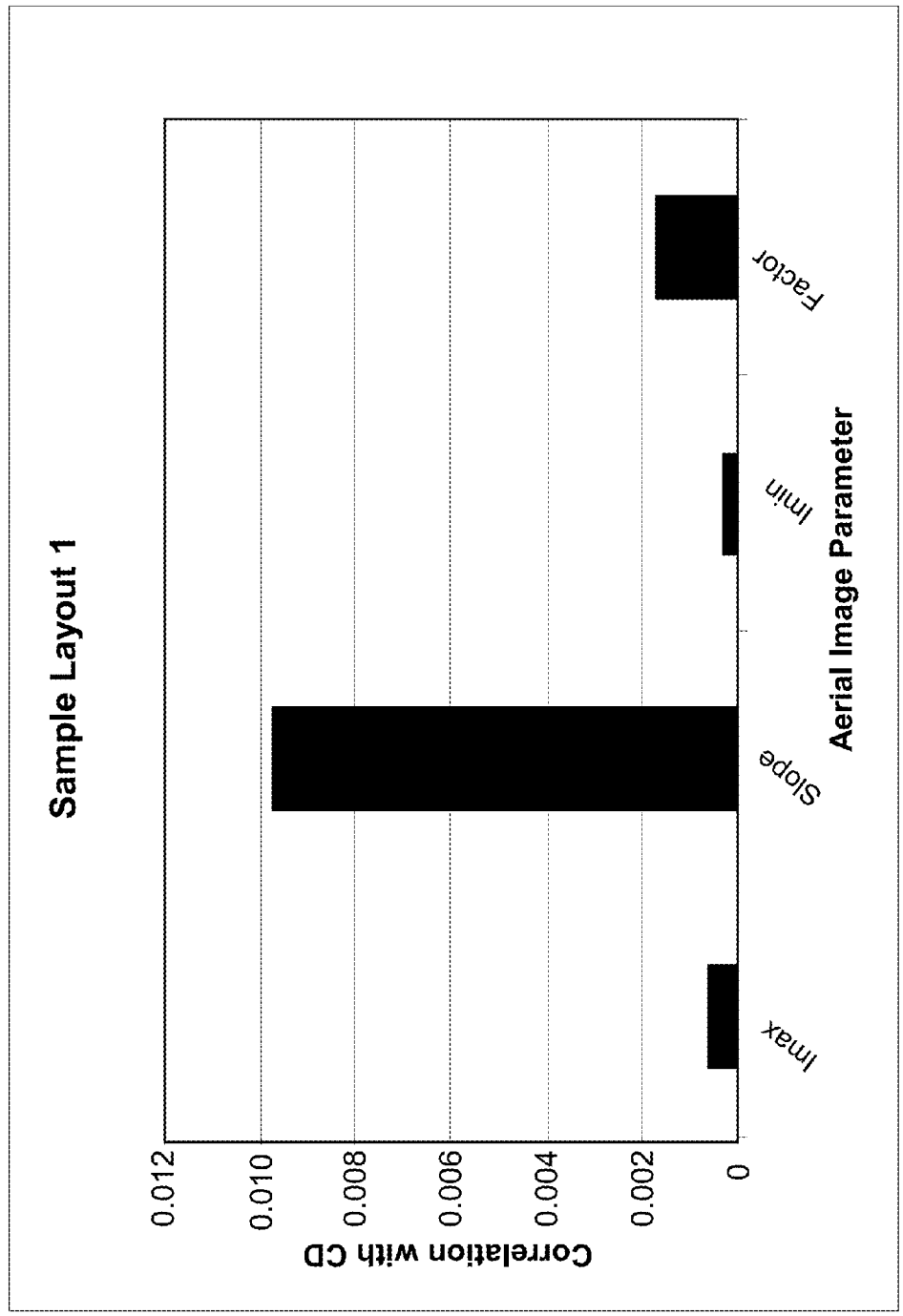
FIG. 3A is a first exemplary histogram illustrating the effectiveness of correlation between areal image slope and a critical dimension.
Figure 3B:
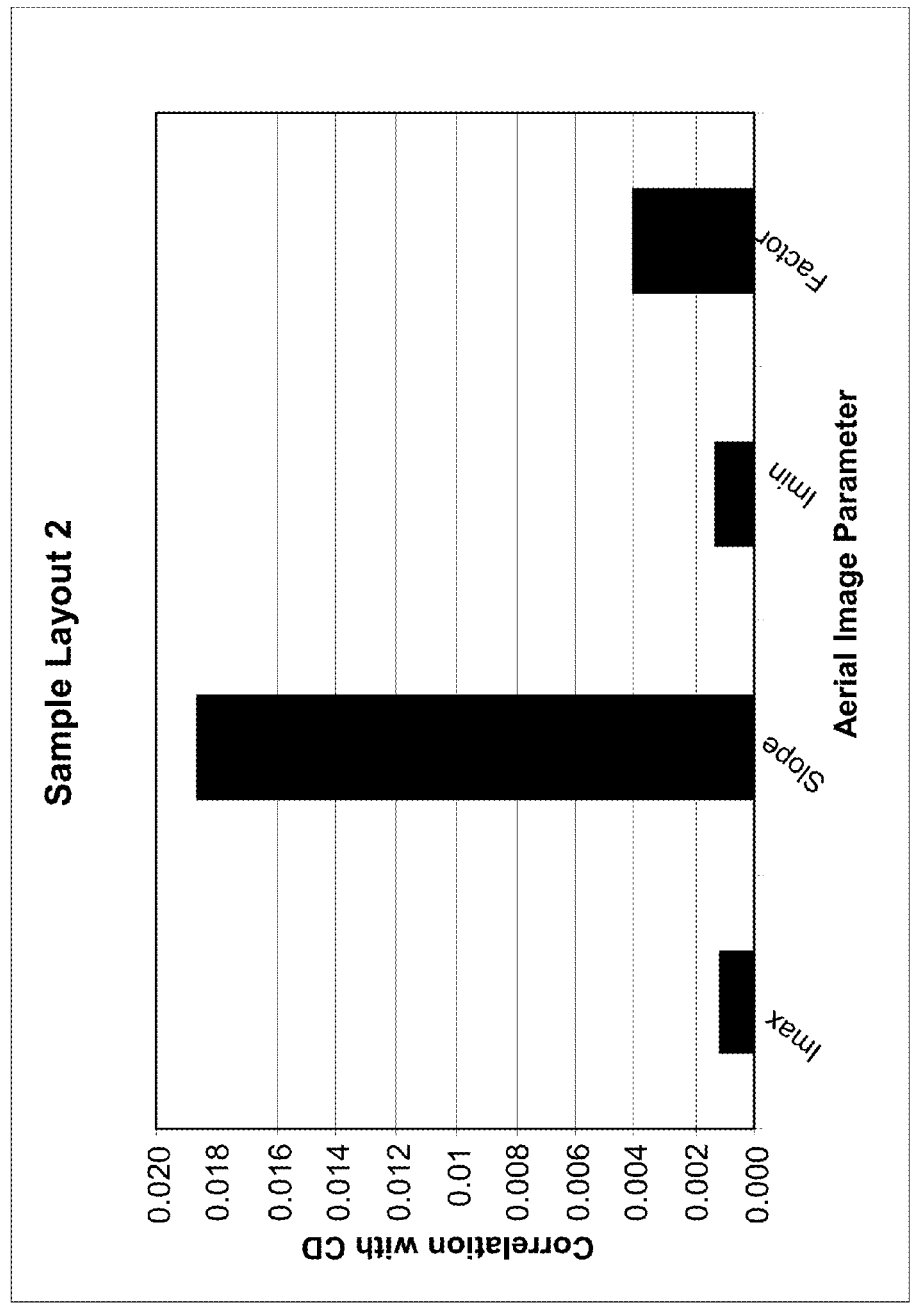
FIG. 3B is a second exemplary histogram illustrating the effectiveness of correlation between areal image slope and a critical dimension.

Referring to FIGS. 3A and 3B, correlation coefficients between measured critical dimensions (such as the diameter of a minimum-size printable contact hole, a minimum width of a printable line, a minimum space between two printable lines) and corresponding areal image slopes are shown for a set of design shapes in two sample layouts. The correlation coefficients between measured critical dimensions and corresponding areal image slopes are orders of magnitude greater than other correlation coefficients between measured critical dimensions and each of intensity maximum, intensity minimum, and a curvature in the areal image (called "factor"). Thus, FIGS. 3A and 3B illustrate the effectiveness of correlation between the areal image slope and a critical dimension.

Figure 4B:
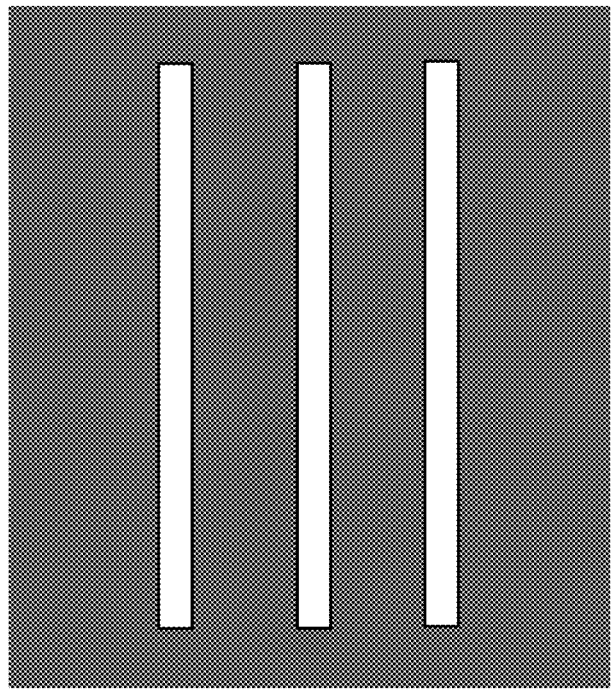
FIG. 4B is an exemplary design clip that illustrate a low perimeter to area ratio according to an embodiment of the present disclosure.
Figure 4A:
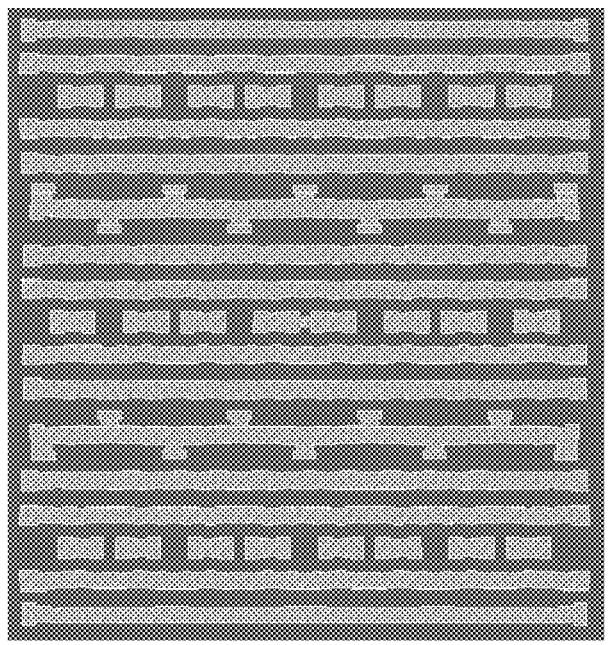
FIG. 4A is an exemplary design clip that illustrates a high perimeter to area ratio according to an embodiment of the present disclosure.

Another of the parameters employed in embodiments of the present disclosure is a perimeter to area ratio. The parameter to area ratio is the ratio of the sum of the lengths of peripheries of all design shapes within a design clip to the area of the design clip. FIG. 4A illustrates a high perimeter to area ratio, and FIG. 4B illustrate a low perimeter to area ratio.

Figure 5:
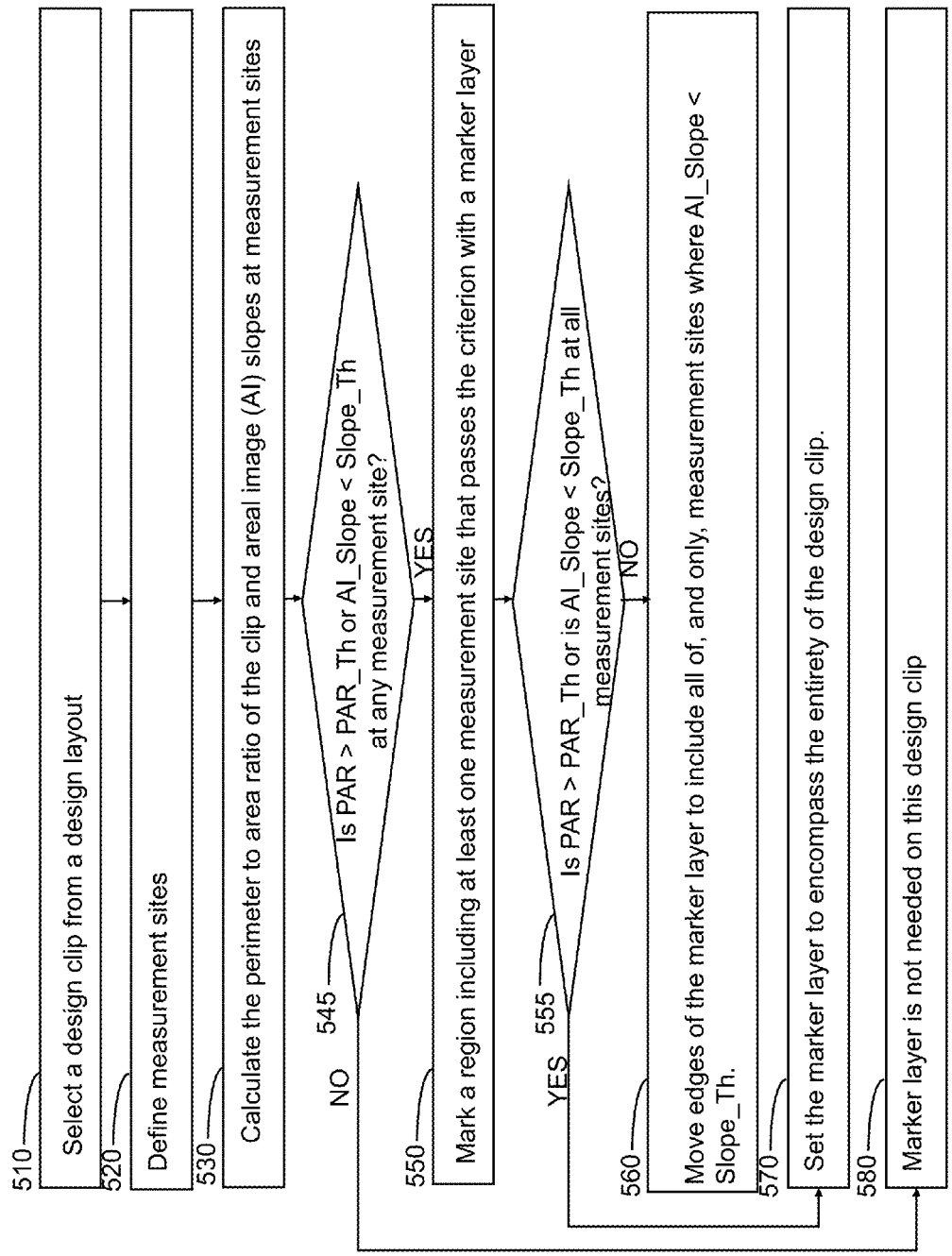
FIG. 5 is a flow chart illustrating a method of determining a marker layer for each design clip from a design layout according to an embodiment of the present disclosure.

Referring to FIG. 5, a flow chart illustrates an exemplary method of determining a marker layer for each design clip from a design layout according to an embodiment of the present disclosure. The flow chart of FIG. 5 includes non-limiting exemplary steps that can be employed to perform the steps of: assigning at least one measurement site to each of the at least one design clip; determining, for each selected design clip among the at least one design clip, whether the selected design clip satisfies a predetermined criterion; and marking, for each selected design clip that satisfies the criterion, each region that satisfies the predetermined condition with a marker layer. Further, the flow chart of FIG. 5 includes non-limiting exemplary steps that can be employed to perform the steps of: assigning at least one measurement site to each of the at least one design clip; determining, for each selected design clip among the at least one design clip, whether the selected design clip satisfies a predetermined criterion for classifying the selected design clip as including at least one complex design feature; marking, for each selected design clip that is identified as satisfying the predetermined condition, a region that satisfies the predetermined condition with a marker layer.

In one embodiment, the predetermined criterion can include at least one of whether the selected design clip has a perimeter to area ratio that is greater than a predefined critical perimeter to area ratio and whether the selected design clip includes a measurement site at which an areal image slope is less than a predefined critical areal image slope.

In one embodiment, the predetermined criterion can include one or a logical combination of: whether the selected design clip has a perimeter to area ratio that is greater than a predefined critical perimeter to area ratio; and whether the selected design clip includes a measurement site at which an areal image slope is less than a predefined critical areal image slope. As used herein, a logical combination of at least one condition includes identity with any one of the at least one condition, an "AND" combination that requires that two or more of the at least one condition are simultaneously satisfied, and an "OR" combination that requires that two or more of the at least one condition are alternatively satisfied, or any derivative combinations of at least one "AND" combination and at least one "OR" combination.

In one embodiment, the predetermined criterion includes a logical combination of whether the selected design clip has a perimeter to area ratio that is greater than a predefined critical perimeter to area ratio.

In one embodiment, the predetermined criterion can include a logical combination of whether the selected design clip includes a measurement site at which an areal image slope is less than a predefined critical areal image slope.

In one embodiment, the predetermined criterion is whether the selected design clip has a perimeter to area ratio that is greater than a predefined critical perimeter to area ratio or whether the selected design clip includes a measurement site at which an areal image slope is less than a predefined critical areal image slope.

While the flow chart of FIG. 5 represents an embodiment in which the predetermined criterion is whether the selected design clip has a perimeter to area ratio that is greater than a predefined critical perimeter to area ratio or whether the selected design clip includes a measurement site at which an areal image slope is less than a predefined critical areal image slope, one of ordinary skill in the art can construct variations of the flow chart of FIG. 5 representing embodiments variations of the predetermined criterion as discusses above.

Referring to step 510, a design clip from a design layout is selected.

Figure 6A:
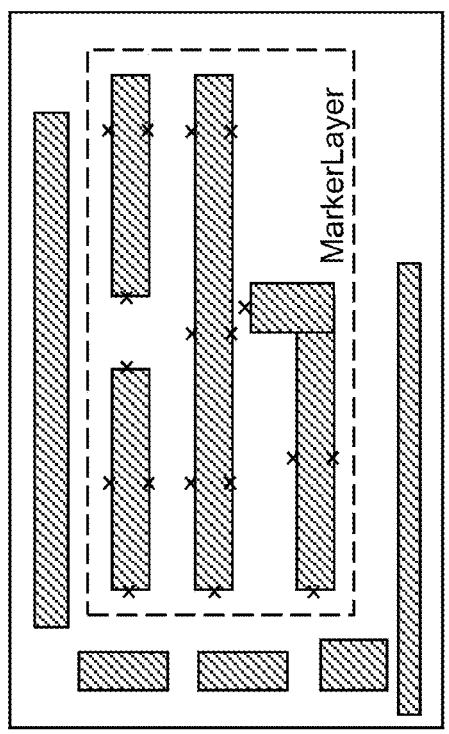
FIG. 6A is an exemplary design clip in which an initial marker layer is identified according to an embodiment of the present disclosure.
Figure 6B:
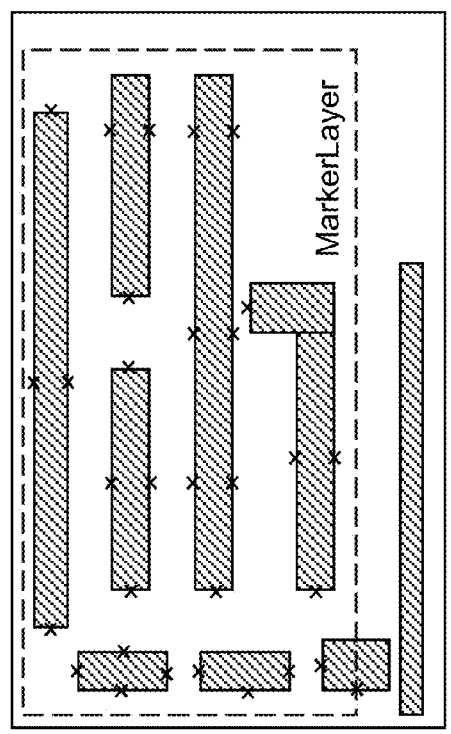
FIG. 6B is an exemplary design clip in which a marker layer has been adjusted according to an embodiment of the present disclosure.

Referring to step 520, measurement sites are defined within the selected design clip. The measurement sites can be selected employing any algorithm provided that sensitive regions of the selected design layout that is subject to poor printing are systematically represented. In a non-limiting example, the measurement sites can be selected from peripheries of the various design shapes present within the selected design clip. Examples of selection of measurement sites are illustrated in FIGS. 6A and 6B, in which the "x" marks represent the measurement sites.

Referring to step 530, the perimeter to area ratio of the design clip is calculated. Specifically, the length of the entire peripheries within the design clip is calculated, and is divided by the area of the clip to generate the perimeter to area ratio of the design clip.

Further, areal image (AI) slope is calculated at each measurement site. The AI slope can be calculated at each measurement site, for example, by running an optical model on the design clip to generate a simulated intensity distribution, and by calculating the magnitude of a two-dimensional gradient of the simulated intensity distribution at each measurement site. The AI slope is the magnitude of the two-dimensional gradient of the simulated intensity distribution. The set of values for the AI slope at each measurement site is stored for comparison in subsequent steps.

Referring to step 545, the perimeter to area ratio (PAR) of the design clip is compared with a threshold perimeter to area ratio (PAR_Th), which is a predetermined quantity provided by a person performing the method of FIG. 5 or provided as one of program parameters for an automated program to be run on a computing means. Further, the AI slope as determined at each measurement site is compared with a threshold areal image slope (Slope_Th), which is a predetermined quantity provided by the person performing the method of FIG. 5 or provided as one of program parameters for an automated program to be run on the computing means.

If the perimeter to area ratio (PAR) of the design clip is not greater than the threshold perimeter to area ratio (PAR_Th), and whether the AI slopes are not less than the threshold areal image slope (Slope_Th) at all measurement sites, the process flow proceeds to step 580. In this case, there is no measurement site within the selected design clip at which the AI slope is less than the threshold areal image slope. Thus, the simulated image of the design clip has a sharp contrast at every measurement site. Further, the design clip has a lesser total peripheral lengths for the design shapes therein than the total peripheral lengths corresponding to the threshold perimeter to area ratio. Such a design clip is expected to print without issues. A marker layer is not needed for this design clip.

If the perimeter to area ratio (PAR) of the design clip is greater than the threshold perimeter to area ratio (PAR_Th), or whether an AI slope is less than the threshold areal image slope (Slope_Th) at any measurement site, the process flow proceeds to step 550. The marker layer, as initially provided at step 550, can encompass the entirety of the design clip, or can include at least one measurement site at which the AI slope is less than the threshold areal image slope.

Referring to step 555, the perimeter to area ratio (PAR) of the design clip and the set of AI slopes for all measurement sites are analyzed to determine whether a criterion is met. The criterion is whether the perimeter to area ratio (PAR) of the design clip is greater than the threshold perimeter to area ratio (PAR_Th), or whether the AI slopes are less than the threshold areal image slope (Slope_Th) at all measurement sites. If this criterion is met, the process flow proceeds to step 570, at which the marker layer is set to encompass the entirety of the design clip.

If the criterion of step 555 is not met, the process flow can proceed to step 560. For each measurement site, the criterion is a logical "OR" combination of whether the perimeter to area ratio (PAR) of the design clip is greater than the threshold perimeter to area ratio (PAR_Th), or whether the corresponding AI slopes are less than the threshold areal image slope (Slope_Th). Because the perimeter to area ratio (PAR) of the design clip is not greater than the threshold perimeter to area ratio at step 560 (otherwise, the process flow would have proceeded to step 570), only the areal image slopes need to be analyzed. At step 560, edges of the marker layer as provided at step 550 is moved to include all measurement sites where the criterion of AI_Slope<Slope_Th is satisfied, and does not include any measurement site where the criterion of AI_Slope<Slope_Th is not satisfied.

FIGS. 6A and 6B illustrate movement of a marker layer in a design clip. The initial marker layer illustrated in FIG. 6A and generated at step 550 can be moved as illustrated in FIG. 6B at step 560.

In general, for each selected design clip that is identified as including at least one measurement point satisfying the predetermined condition, the marker layer can be moved to include all measurement sites within the selected design clip that satisfies the predetermined condition. All measurement sites that do not satisfy the predetermined condition can be excluded from the marker layer.

In one embodiment, the size of a selected design clip can be altered. For example, if the marker layer extends to an edge of the design clip, the design clip can be extended by incorporating portions of at least another design clip within the same design layout. The at least another design clip can be adjusted to account for the incorporation of the portions into the design clip.

The method of the flow chart of FIG. 5 or methods of any variations of the flow chart of FIG. 5 can be applied to each selected design clip until all design clips are processed. To identify regions having different levels of design complexity, additional steps can be performed. For example, regions marked with the marker layer can be classified as a first set of regions, and regions not marked with the marker layer can be classified as a second set of regions. Further, data identifying at least one of the first set of regions and the second set of regions can be subsequently stored in a non-transitory machine-readable data storage medium.

Optical proximity correction can be performed on the design layout employing a plurality of OPC programs. For example, OPC can be performed on regions not marked with the marker layer with an OPC program, and on regions marked with the marker layer with at least another OPC program different from the OPC program.

A plurality of OPC programs to be applied to the design layout includes an OPC program corresponding to the simple OPC program of FIG. 1, and the at least another OPC program that collectively corresponds to the rigorous OPC program of FIG. 1. The plurality of OPC programs can be generated, for example, by comparing a critical dimension between an optical model prediction value and measured data corresponding to a plurality of combinations of dose and depth of focus conditions. In one embodiment, the OPC program corresponding to the simple OPC program of FIG. 1 can be generated from a combination corresponding to a standard (nominal) dose and depth of focus condition, and the at least another OPC program corresponding to the rigorous OPC program of FIG. 1 can be generated from at least another combination corresponding to at least one non-standard dose and depth of focus condition.

Figure 7:
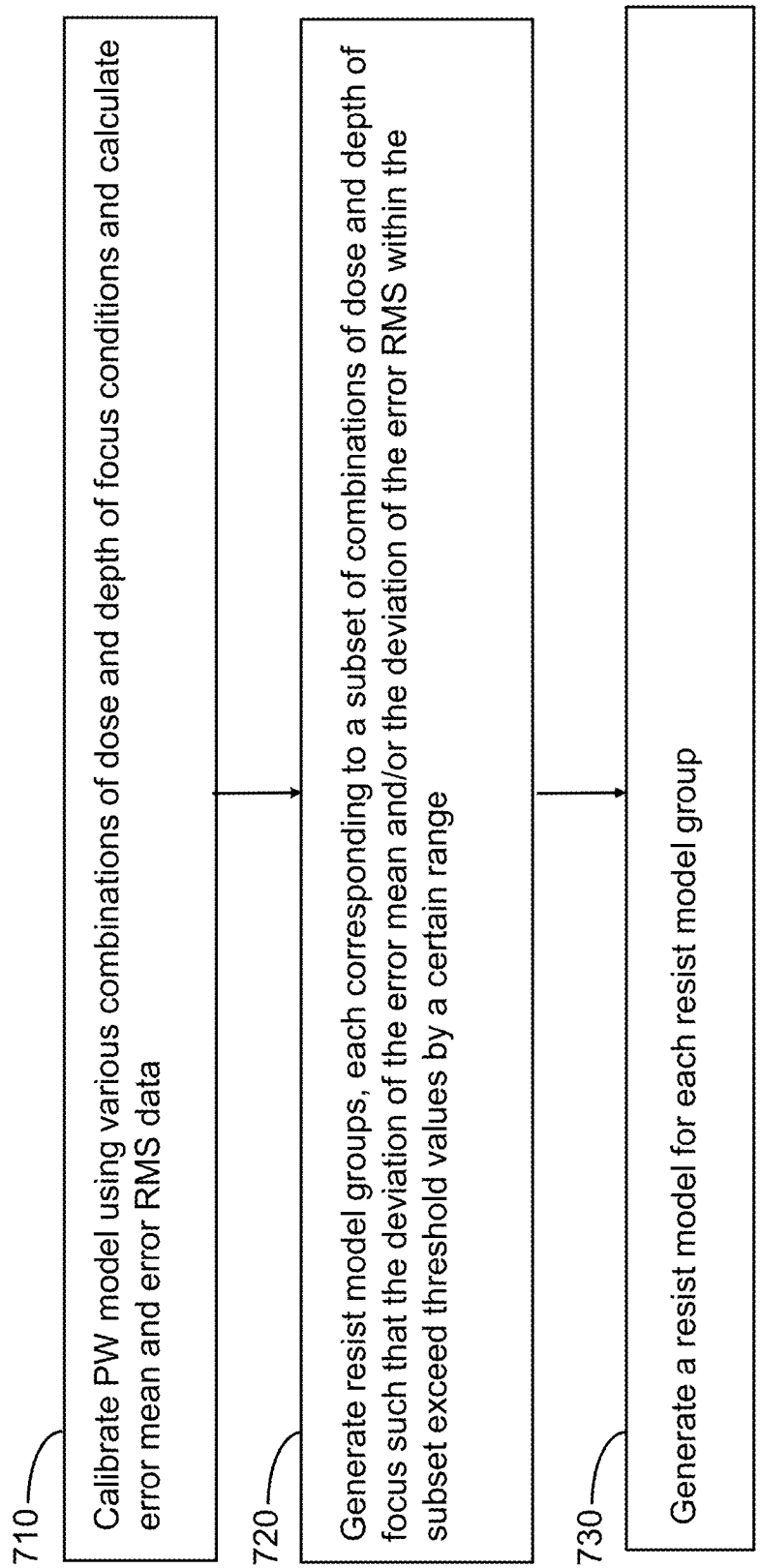
FIG. 7 is a flow chart illustrating a method of generating multiple resist models to be employed in process models according to an embodiment of the present disclosure.

Referring to FIG. 7, a method of generating multiple resist models to be employed in process models is illustrated. Referring to step 710, a process window (PW) model can be calibrated using various combinations of dose and depth of focus conditions. A metric for measuring an accuracy of the PW model can be calculated for each combination of dose and depth of focus condition. For example, an error mean and an error root-mean-square (RMS) can be calculated for each combination of dose and depth of focus condition. An error mean is the difference between the average of critical dimensions as measured on a lithographically exposed and developed photoresist layer and the corresponding optical model prediction value as provided by an optical model for a combination of dose and depth of focus condition. An error RMS is the root-mean-square deviation of the various measurement data for the critical dimensions as measured on the lithographically exposed and developed photoresist layer for a combination of dose and depth of focus condition.

In one embodiment, an error mean and an error root-mean-square (RMS) between the optical model prediction value and the measured data can be generated for each of the plurality of combinations. Subsets of the plurality of combinations having an error mean having an absolute value that exceeds a predefined threshold error mean absolute value or an error RMS that exceeds a predefined threshold error RMS value are subsequently identified. The subsets are classified into categories having non-overlapping ranges for the error mean and the error RMS.

Table 1 shows identification of subsets of plurality of combinations having an error mean having an absolute value that exceeds a predefined threshold error mean absolute value or an error RMS that exceeds a predefined threshold error RMS value.

TABLE 1

Exemplary dose and depth of focus conditions and corresponding error means and error RMS.

| Combination No. | Dose/Nominal dose | Depth of focus (micron) | Error mean (nanometer) | Error RMS (nanometer) |
|---|---|---|---|---|
| 1 | 0.987 | 0.030 | 0.310 | 1.968 |
| 2 | 1.000 | 0.030 | 0.843 | 2.027 |
| 3 | 1.013 | 0.030 | 0.865 | 2.090 |
| 4 | 0.975 | 0.015 | −0.328 | 1.561 |
| 5 | 0.987 | 0.015 | −1.330 | 1.785 |
| 6 | 1.000 | 0.015 | −0.404 | 1.995 |
| 7 | 1.013 | 0.015 | −0.902 | 1.993 |
| 8 | 1.025 | 0.015 | 0.403 | 1.700 |
| 9 | 0.975 | 0.000 | 0.172 | 1.880 |
| 10 | 0.987 | 0.000 | −0.352 | 1.909 |
| 11 | 1.000 | 0.000 | −0.404 | 2.153 |
| 12 | 1.013 | 0.000 | −0.250 | 1.614 |
| 13 | 1.025 | 0.000 | 0.480 | 1.801 |
| 14 | 1.000 | 0.000 | −1.739 | 2.910 |
| 15 | 0.975 | −0.015 | 0.243 | 2.070 |
| 16 | 0.987 | −0.015 | 0.550 | 1.842 |
| 17 | 1.000 | −0.015 | 0.233 | 1.424 |
| 18 | 1.013 | −0.015 | 0.359 | 1.788 |
| 19 | 1.025 | −0.015 | 0.319 | 1.502 |
| 20 | 0.987 | −0.030 | 0.784 | 1.733 |
| 21 | 1.000 | −0.030 | 1.433 | 1.877 |
| 22 | 1.013 | −0.030 | 1.411 | 2.351 |
| 23 | 1.000 | −0.045 | 1.555 | 2.524 |

In Table 1, conditions in which absolute value for the error mean is not greater than 1.0 nm and error RMS is not greater than 2.0 nm can be selected to generate a standard resist model, which can be employed for a standard OPC program. Conditions in which absolute value for the error mean is greater than 1.0 nm or error RMS is greater than 2.0 nm can be selected to generate non-standard resist models, which can be employed for the rigorous OPC program, i.e., at least another OPC program that is different from the standard OPC program. In this example, conditions 2, 3, 5, 11, 14, 15, 21, 22, and 23 are employed to generate non-standard resist models.

Subsets of the plurality of combinations having an error mean having an absolute value that exceeds a predefined threshold error mean absolute value or an error RMS that exceeds a predefined threshold error RMS value can be categorized. Such subsets include conditions 2, 3, 5, 11, 14, 15, 21, 22, and 23. A first category includes conditions 2, 3, and 15, in which an error mean is between 0 and 1.0 nm and the corresponding error RMS is greater than 2.0 nm. A second category includes condition 5, in which an error mean is between −2.0 nm and −1.0 nm and the corresponding error RMS is less than 2.0 nm. A third category includes condition 11, in which an error mean is between −1.0 nm and 0.0 nm and the corresponding error RMS is greater than 2.0 nm. A fourth category includes condition 14, in which an error mean is between −2.0 nm and −1.0 nm and the corresponding error RMS is greater than 2.0 nm. A fifth category includes condition 21, in which an error mean is between 1.0 nm and 2.0 nm and the corresponding error RMS is less than 2.0 nm. A sixth category includes conditions 22 and 23, in which an error mean is between 1.0 nm and 2.0 nm and the corresponding error RMS is greater than 2.0 nm. A resist model can be constructed for each category, and can be employed to generate a plurality of non-standard OPC programs that are more rigorous than the standard OPC program. For example, the parameters of the non-standard OPC programs can include a reduced size for fragments and/or an increased number of iteration cycles before completing the correction process.

In general, different resist models can be generated for each of the categories. Each of the at least another OPC program can includes one of the resist models thus generated.

Figure 8:
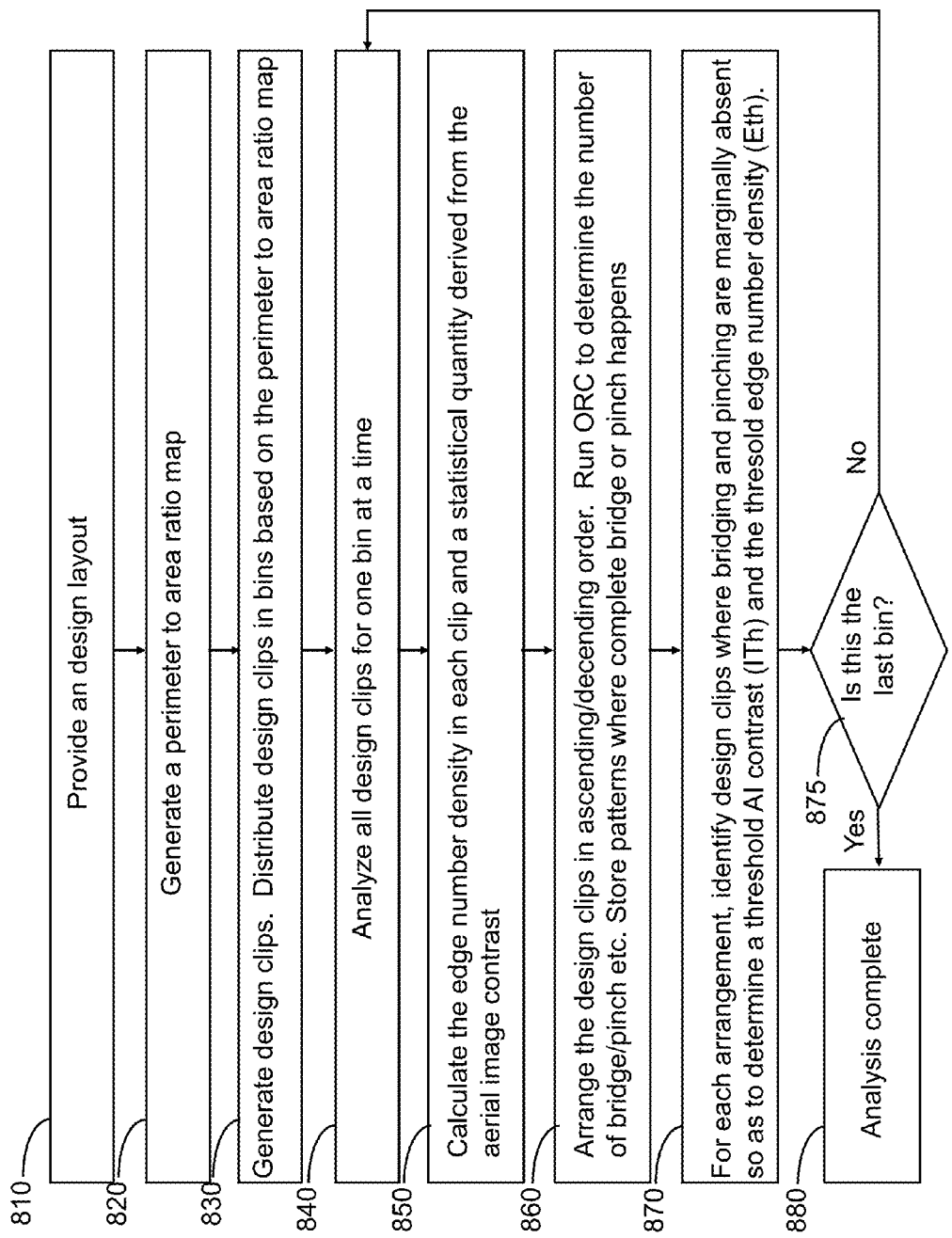
FIG. 8 is a flow chart illustrating a method of sorting design clips that can benefit from application of multiple OPC programs according to an embodiment of the present disclosure.
Figure 9E:
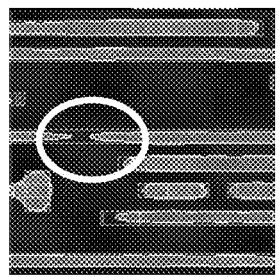
FIGS. 9A-9J are various examples of design clips according to an embodiment of the present disclosure.
Figure 9D:
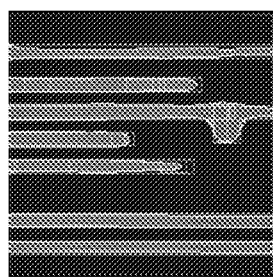
Figure 9C:
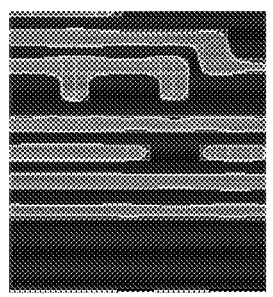
Figure 9B:
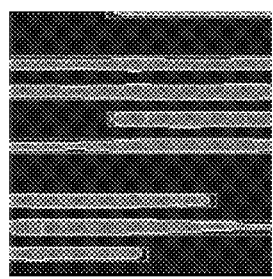
Figure 9A:
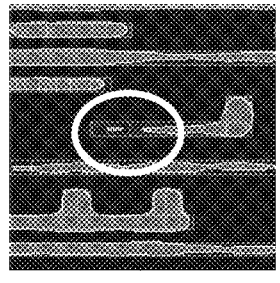
Figure 9J:
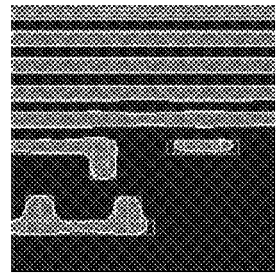
Figure 9I:
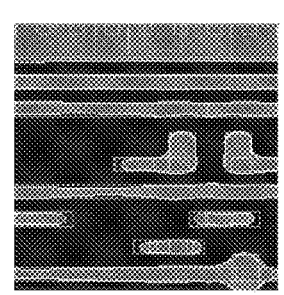
Figure 9H:
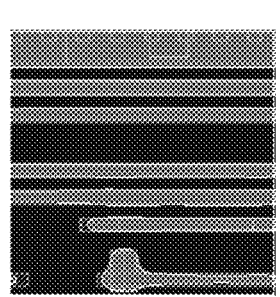
Figure 9G:
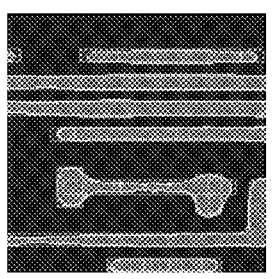
Figure 9F:
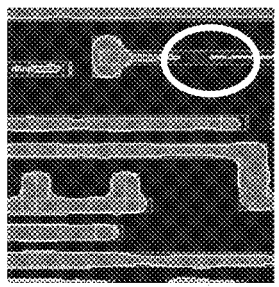

Referring to FIG. 8, a flow chart illustrates a method of sorting design clips that can benefit from application of multiple OPC programs according to an embodiment of the present disclosure. The method of the flow chart of FIG. 8 can be employed to perform optical proximity correction on a design layout. The method can include, for example, generating a map of a perimeter to area ratio for the design layout; sorting a plurality of design clips from the design layout into a plurality of bins, wherein each bin includes a non-overlapping range of values for the perimeter to area ratio; determining, for each bin selected from the plurality of bins, a threshold value for each of at least one layout complexity parameter for design clips within the selected bin, wherein the threshold value characterizes design clips in which bridging or pinching of design shapes is marginally absent; classifying, for each selected bin, design clips into first design clips that has, for each of the at least one layout complexity parameter, a value that represents less complexity than a corresponding threshold value, and into second design clips that include all other design clips than the first design clips; and performing OPC on the first design clips with a first OPC program and performing OPC on the second design clips with at least one second OPC program different from the OPC program.

In one embodiment, the at least one layout complexity parameter can includes a statistical quantity derived from an areal image contrast of a corresponding design clip.

In one embodiment, the at least one design layout complexity parameter includes an edge number density defined by a total number of edges in a corresponding design clip divided by a total area of the corresponding design clip.

In one embodiment, the at least one layout complexity parameter can include: a statistical quantity derived from an areal image contrast of a corresponding design clip; and an edge number density defined by a total number of edges in a corresponding design clip divided by a total area of the corresponding design clip.

In yet another embodiment, the method illustrated in FIG. 8 or a variation of the method of FIG. 8 can be employed in conjunction with the method of FIG. 1 such that the method of FIG. 8 (or a variation thereof) is performed first, and the method of FIG. 1 is performed next. The same design layout can be employed in the sequential application of the methods of FIGS. 8 and 1, and the second design clips of the method of FIG. 8 (or variations thereof) can be employed as the at least one design clip of FIG. 1, and the at least one second OPC program of FIG. 8 can include the OPC program and the at least another OPC program of FIG. 1.

While the flow chart of FIG. 8 represents an embodiment in which the at least one layout complexity parameter includes an areal image contrast of a corresponding design clip and an edge number density, one of ordinary skill in the art can construct variations of the flow chart of FIG. 8 representing embodiments variations of the at least one layout complexity parameter as discusses above.

The method of the flow chart of FIG. 8 or any variation thereof can be implemented employing a system for performing optical proximity correction on a design layout. The system can include a computing means and a non-transitory machine-readable data storage medium. The computing means includes a processor and a memory that are configured to run a automated program including steps of: generating a map of a perimeter to area ratio for the design layout; sorting a plurality of design clips from the design layout into a plurality of bins, wherein each bin includes a non-overlapping range of values for the perimeter to area ratio; determining, for each bin selected from the plurality of bins, a threshold value for each of at least one layout complexity parameter for design clips within the selected bin, wherein the threshold value characterizes design clips in which bridging or pinching of design shapes is marginally absent; and classifying, for each selected bin, design clips into first design clips that has, for each of the at least one layout complexity parameter, a value that represents less complexity than a corresponding threshold value, and into second design clips that include all other design clips than the first design clips; performing OPC on the first design clips with a first OPC program and performing OPC on the second design clips with at least one second OPC program different from the OPC program; and storing data representing results of the performance of OPC with the OPC program and the performance of OPC with the at least another OPC program in the non-transitory machine-readable data storage medium.

Referring to step 810, a design layout is provided.

Referring to step 820, a perimeter to area ratio map is generated for the design layout. In one embodiment, a mesh can be generated for the design layout, and the perimeter to area ratio can be calculated for each intersection point of the mesh. In one embodiment, the perimeter to ratio can be calculated employing an area of a predetermined shape and size that is centered at the intersection point at which the calculation is performed. In one embodiment, the size of each mesh segment can be at least one order of magnitude greater than the grid size of the design layout.

Referring to step 830, design clips are generated by dividing the design layout. The size of the design clips can be set such that each design clip includes at least one intersection point of the mesh. In one embodiment, each design clip includes a plurality of intersection points of the mesh.

For each design clip, an average perimeter to area ratio for the design clip can be generated by calculating the mathematical average of all perimeter to area ratios within the design clip. The design clips are then distributed in bins based on the average perimeter to area ratio for the design clips. Each bin has a non-overlapping range of values for the perimeter to area ratio relative to other bins.

Referring to step 840, one bin is selected for analysis at a time, and all design clips in the selected bin are analyzed in subsequent steps, i.e., steps 850, 860, and 870.

Referring to step 850, the edge number density is calculated within each design clip. The edge number density is defined by the total number of edges in a design clip divided by the total area of the corresponding design clip. Thus, the edge number density is calculated by dividing the total number of edges within a given design clip by the total area of the chip.

Further, a statistical quantity derived from the areal image contrast of the design clip is generated. The statistical quantity can be the average of the areal image contrast, the average of a lower percentile (e.g., the lowest 10%, the quartile, the lower half, etc.) of the areal image contrast, the minimum of the areal image contrast, or any other metric that characterizes the worst performing portion of the design clip in terms of accurate lithographic reproduction of an image of the design clip. In one embodiment, the calculation of the areal image contrast can be performed at all grid points within the design clip. In another embodiment, the calculation of the areal image contrast can be performed at selected calculation points within the design clip. In this case, the selection of the calculation points can be made in any manner that broadly captures the quality of the areal image contrast within the design clip.

Referring to step 860, the design clips are arranged, i.e., ordered, in an ascending order or in a descending order for a layout complexity parameter for design clips. The design clips are arranged for each layout complexity parameter. Specifically, non-limiting examples of the layout complexity parameter include any statistical quantity derived from the areal image contrast and the edge number density. In one embodiment, the at least one layout complexity parameter can include a statistical quantity derived from an areal image contrast of a corresponding design clip and the edge number density.

For each arrangement of design clips for a layout complexity parameter, optical rule check (ORC) program is performed to the design clips to determine if complete (i.e., non-marginal) bridging or complete pinching of the patterns are present. Patterns containing such a complete bridging or such a complete pinching are removed from the arrangement of the design clips.

For example, the design clips can be arranged for the average areal image (AI) contrast as illustrated in FIGS. 9A-9J. In this example, the design clip of FIG. 9A has the least AI contrast, the design clip of FIG. 9B has a greater AI contrast than the design clip of FIG. 9A, the design clip of FIG. 9C has a greater AI contrast than the design clip of FIG. 9B, the design clip of FIG. 9D has a greater AI contrast than the design clip of FIG. 9C, the design clip of FIG. 9E has a greater AI contrast than the design clip of FIG. 9D, the design clip of FIG. 9F has a greater AI contrast than the design clip of FIG. 9E, the design clip of FIG. 9G has a greater AI contrast than the design clip of FIG. 9F, the design clip of FIG. 9H has a greater AI contrast than the design clip of FIG. 9G, the design clip of FIG. 9I has a greater AI contrast than the design clip of FIG. 9H, and the design clip of FIG. 9J has a greater AI contrast than the design clip of FIG. 9I. Running optical rule check (ORC) program shows pinching occurs in the design clips of FIGS. 9E and 9F.

Referring to step 870, for each arrangement, a design clip is identified at which bridging and pinching are marginally absent as a function of the order within the arrangement. The order within the arrangement can be a parameter for determining the marginal absence of bridging and pinching. In the illustrative case of FIGS. 9A-9J, the design clip at which bridging and pinching are marginally absent as a function of the order within the arrangement, i.e., as a function of the AI contrast, is FIG. 9G.

The order within the arrangement corresponds to the order of a selected layout complexity parameter within the bin. Thus, the value of the selected layout complexity parameter at the identified design clip can be, or can be close to, the critical value of the selected layout complexity parameter at which bridging and pinching are marginally absent. If the selected layout complexity parameter represents greater design complexity at a greater value, a design layout having a value for the selected layout complexity parameter that exceeds the critical value is likely to contain bridging or pinching in a lithographically printed pattern, while a design layout having a value for the selected layout complexity parameter that is less than the critical value is unlikely to contain bridging or pinching in a lithographically printed pattern. Conversely, if the selected layout complexity parameter represents lesser design complexity at a greater value, a design layout having a value for the selected layout complexity parameter that is less than the critical value is likely to contain bridging or pinching in a lithographically printed pattern, while a design layout having a value for the selected layout complexity parameter that is greater than the critical value is unlikely to contain bridging or pinching in a lithographically printed pattern.

FIGS. 10A-10J represent the intensity function I(x,y) of the design clips of FIGS. 9A-9J, respectively, as generated by an optical model. The numeral above each of FIGS. 10A-10J represent the AI contrast of the corresponding intensity function I(x,y) below. The magnitude of the intensity function I(x,y) is represented by the grey scale in each picture. The brighter an area is in each picture, the greater the magnitude of the intensity function I(x,y) in that area. The fuzzier each picture representing the intensity function I(x,y) is, the lower the corresponding AI contrast.

In this case, the selected layout complexity parameter is AI contrast, which represents lesser design complexity at a greater value. In this exemplary case, the critical value for AI contrast can be set as a number between 1764.9 (which is the greater of the two numbers for the AI contrast of FIGS. 11E and 11F in which pinching is present) and 1823.8. Thus, design layouts having a value for AI contrast that is less than the critical value, such as the design layouts of FIGS. 9A, 9B, 9C, 9D, 9E, and 9F, are likely to contain bridging or pinching in a lithographically printed pattern. However, design layouts having a value for AI contrast that is greater than the critical value, such as FIGS. 9G, 9H, 9I, and 9J, are unlikely to contain bridging or pinching in a lithographically printed pattern.

The steps of 860 and 870 can be performed for a plurality of layout complexity parameters. Alternately, the steps of 860 and 870 can be repeated multiple times for different layout complexity parameters. For each layout complexity parameter, the design clips are rearranged in an ascending order or in a descending order for the selected layout complexity parameter for design clips. In one embodiment, at step 860, the design clips are rearranged in the order of the edge number density.

After rearranging the design clips in the order of the edge number density, optical rule check (ORC) program is performed to the design clips to determine if complete (i.e., non-marginal) bridging or complete pinching of the patterns are present. Patterns containing such a complete bridging or such a complete pinching are removed from the arrangement of the design clips. If the rearrangement is performed to the design clips of FIGS. 9A-9J, and if optical rule check (ORC) program is run on the design clips of FIGS. 9A-9J, presence of pinching is detected in the design clips of FIGS. 9E, and 9F, which has the edge number density of 27 and 31, respectively.

Referring to step 870, for each arrangement, a design clip is identified at which bridging and pinching are marginally absent as a function of the order within the arrangement. The order within the arrangement can be a parameter for determining the marginal absence of bridging and pinching. In FIGS. 11A-11J, the design clips of FIGS. 9A-9J are shown with the corresponding AI contrast and the edge number density (in parentheses). The order of the design clips of FIGS. 11A-11J in a rearrangement according to an increasing order for the edge number density would be: FIGS. 11B and 11H with the value of 11 as the edge number density, FIG. 11D with the value of 20 as the edge number density, FIGS. 11A and 11G with the value of 22 as the edge number density, FIGS. 11C and 11J with the value of 26 as the edge number density, FIG. 11E with the value of 27 as the edge number density, FIG. 11F with the value of 31 as the edge number density, and FIG. 11I with the value of 33 as the edge number density. The design clip at which bridging and pinching are marginally absent as a function of the order within this rearrangement, i.e., as a function of the edge number of density, is FIGS. 11C and 11J having the value of 26 as the edge number density.

The order within the arrangement corresponds to the order of a selected layout complexity parameter within the bin. Thus, the value of the selected layout complexity parameter at the identified design clip can be, or can be close to, the critical value of the selected layout complexity parameter at which bridging and pinching are marginally absent. In this case, the selected layout complexity parameter is the edge number density, which represents greater design complexity at a greater value. In this exemplary case, the critical value for the edge number density can be set as a number between 26 and 27, the lower of the two values for the edge number density for FIGS. 11E and 11F in which pinching is present. Thus, design layouts having a value for edge number density that is greater than the critical value, such as the design layouts of FIGS. 11E, 11F, and 11I, are likely to contain bridging or pinching in a lithographically printed pattern. However, design layouts having a value for edge number density that is less than the critical value, such as FIGS. 11A, 11B, 11C, 11D, 11G, 11H, and 11J, are unlikely to contain bridging or pinching in a lithographically printed pattern.

The multiple layout complexity parameters can be employed in conjunction to determine layout clips that are unlikely to include bridging or pinching. For example, design layouts that include AI contrast greater than the critical value for AI contrast and edge number density less than the critical value for edge number density can be identified as the design layouts of FIGS. 11G, 11H, and 11J.

Figure 12:
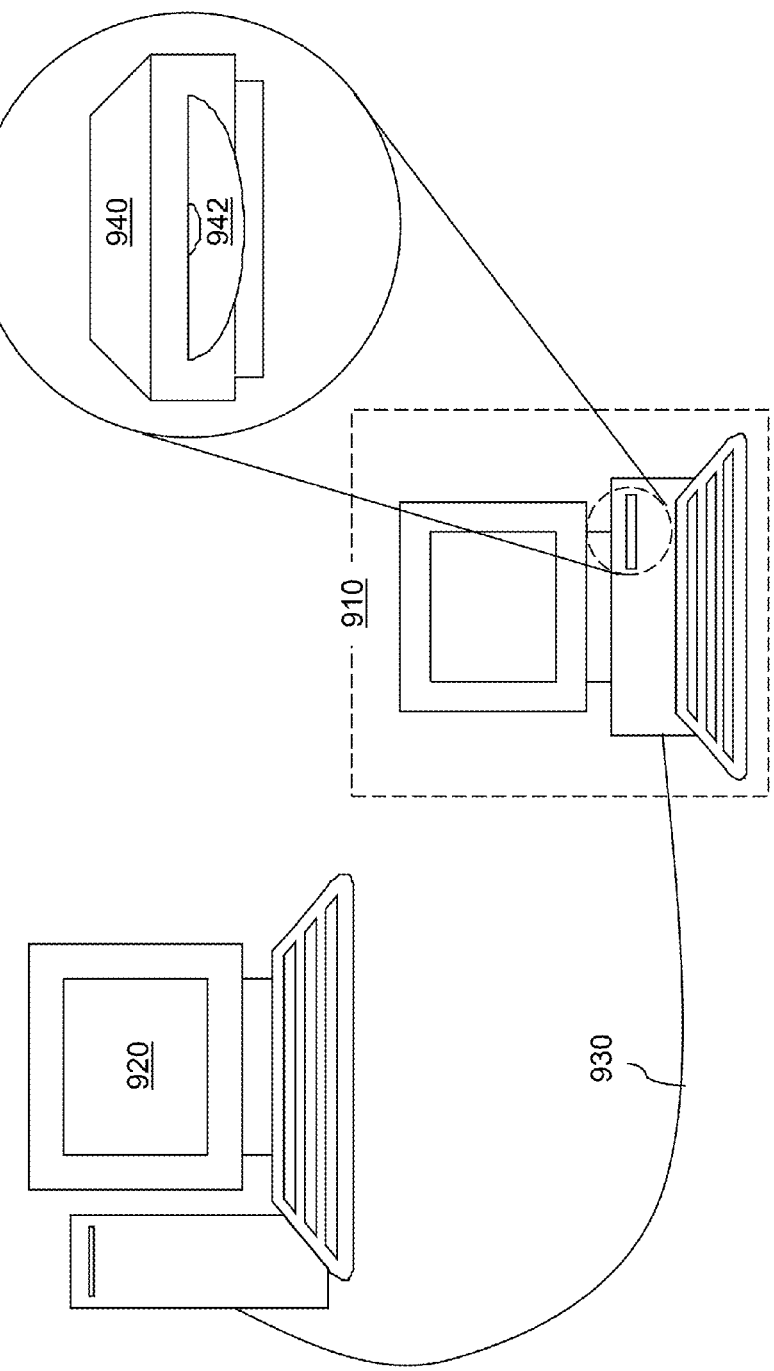
FIG. 12 illustrates an exemplary system for performing optical proximity correction on a design layout.

Referring to FIG. 12, a system can be provided for performing optical proximity correction on a design layout. The system can include at least one computing means 910, which can be a computer or any computing device known in the art. The at least one computing means 910 includes a processor and a memory that are configured to run an automated program. The at least one computing means 910 can be in communication with a database 920, which can be a standalone computing means or can be incorporated into the at least one computing means 910. If the database 920 is a standalone computing means, a data cable 930 or wireless communication can be employed to transfer data between the database 920 and the at least one computing means 910. The system further includes a non-transitory machine-readable data storage medium, which can be embedded within the at least one computing means 910, can be present within the database 920, or can be provided as a portable non-transitory machine-readable data storage medium 942 that can be accessed employing a data-writing device 940, which can optionally perform the task of reading data from the portable non-transitory machine-readable data storage medium 942. The database 920 can store design layouts, optical models, resist models, and/or OPC models. If the database 920 is not provided, design layouts, optical models, resist models, and/or OPC models can be stored in the at least one computing means 910.

The at least one computing means 910 can be employed to perform at least one or all steps FIG. 1, FIG. 5, FIG. 7, and FIG. 8. The at least one computing means 910 can be configured to perform the various steps in FIG. 1, FIG. 5, FIG. 7, and/or FIG. 8 automatically without human intervention once a design layout is provided. The result derived from any of the steps of FIG. 1, FIG. 5, FIG. 7, and/or FIG. 8 can be stored in at least one non-transitory machine-readable data storage medium that can be provided within the at least one computing means 910 and/or within at least one non-transitory machine-readable data storage medium provided within the database 920. The non-transitory machine-readable data storage medium may be of any type known in the art.

One or more non-transitory machine readable medium within the at least one computing means 910 and/or the database 920 can be a portable non-transitory machine-readable data storage medium 942 such as a CD ROM or a DVD ROM. A data-writing device 940 may be provided in the at least one computing means 910 or within the database 920 to enable storage of any data derived from the steps of FIG. 1, FIG. 5, FIG. 7, and/or FIG. 8.

In one embodiment, the automated program can include steps of: generating at least one design clip from the design layout, wherein each of the at least one design clip includes a subset of the design layout; assigning at least one measurement site to each of the at least one design clip; determining, for each selected design clip among the at least one design clip, whether the selected design clip satisfies a predetermined criterion for classifying the selected design clip as including at least one complex design feature; marking, for each selected design clip that is identified as satisfying the predetermined condition, a region that satisfies the predetermined condition with a marker layer; performing OPC on regions not marked with the marker layer with an OPC program and performing OPC on regions marked with the marker layer with at least another OPC program different from the OPC program; and storing data representing results of the performance of OPC with the OPC program and the performance of OPC with the at least another OPC program in the non-transitory machine-readable data storage medium.

In one embodiment, the predetermined criterion in the automated program includes one or a logical combination of: whether the selected design clip has a perimeter to area ratio that is greater than a predefined critical perimeter to area ratio; and whether the selected design clip includes a measurement site at which an areal image slope is less than a predefined critical areal image slope.

In one embodiment, the automated program can further include a step of moving, for each selected design clip that is identified as satisfying the predetermined condition, the marker layer to include all measurement sites within the selected design clip that satisfies the predetermined condition.

In one embodiment, the automated program can further include a step of generating a plurality of OPC programs including the OPC program and the at least another OPC program by comparing a critical dimension between an optical model prediction value and measured data corresponding to a plurality of combinations of dose and depth of focus conditions.

In one embodiment, the automated program can include steps of: generating a map of a perimeter to area ratio for the design layout; sorting a plurality of design clips from the design layout into a plurality of bins, wherein each bin includes a non-overlapping range of values for the perimeter to area ratio; determining, for each bin selected from the plurality of bins, a threshold value for each of at least one layout complexity parameter for design clips within the selected bin, wherein the threshold value characterizes design clips in which bridging or pinching of design shapes is marginally absent; and classifying, for each selected bin, design clips into first design clips that has, for each of the at least one layout complexity parameter, a value that represents less complexity than a corresponding threshold value, and into second design clips that include all other design clips than the first design clips; performing OPC on the first design clips with a first OPC program and performing OPC on the second design clips with at least one second OPC program different from the OPC program; and storing data representing results of the performance of OPC with the OPC program and the performance of OPC with the at least another OPC program in the non-transitory machine-readable data storage medium.

In one embodiment, the at least one layout complexity parameter includes: a statistical quantity derived from an areal image contrast of a corresponding design clip; and an edge number density defined by a total number of edges in a corresponding design clip divided by a total area of the corresponding design clip.

In one embodiment, the automated program can be configured to perform the steps of FIGS. 8 and 1 consecutively employing the second design clips as the at least one design clip of FIG. 1. The at least one second OPC program can includes the OPC programs of FIG. 1.

While the disclosure has been described in terms of specific embodiments, it is evident in view of the foregoing description that numerous alternatives, modifications and variations will be apparent to those skilled in the art. Various embodiments of the present disclosure can be employed either alone or in combination with any other embodiment, unless expressly stated otherwise or otherwise clearly incompatible among one another. Accordingly, the disclosure is intended to encompass all such alternatives, modifications and variations which fall within the scope and spirit of the disclosure and the following claims.

What is claimed is:

1. A method of performing optical proximity correction on a design layout, said method comprising:
    a first step of generating at least one design clip from said design layout, wherein each of said at least one design clip includes a subset of said design layout;
    a second step of assigning at least one measurement site to each of said at least one design clip;
    a third step of determining, for each selected design clip among said at least one design clip, whether said selected design clip satisfies a predetermined criterion for classifying said selected design clip as including at least one complex design feature, wherein said predetermined criterion includes one or a logical combination of whether said selected design clip has a perimeter to area ratio that is greater than a redefined critical perimeter to area ratio, and whether said selected design clip includes a measurement site at which an areal image slope is less than a predefined critical areal image slope, said areal image slope being a magnitude of a two-dimensional gradient of areal image intensity that is measured for a simulated intensity distribution that corresponds to said selected design clip;
    a fourth step of marking, for each selected design clip that is identified as satisfying said predetermined criterion, a region that satisfies said predetermined criterion with a marker layer; and
    a fifth step of performing OPC on regions not marked with said marker layer with an OPC program and performing OPC on regions marked with said marker layer with at least another OPC program different from said OPC program,
    wherein at least one of said second, third, fourth, and fifth steps is performed employing a system configured for performing optical proximity correction on design layouts, said system comprising a computing means and a non-transitory machine-readable data storage medium, wherein said computing means comprises a processor and a memory that are configured to run an automated program comprising said at least one of said second, third, fourth, and fifth steps.

2. The method of claim 1, wherein said predetermined criterion includes a logical combination of whether said selected design clip has a perimeter to area ratio that is greater than a predefined critical perimeter to area ratio.

3. The method of claim 1, wherein said predetermined criterion includes a logical combination of whether said selected design clip includes a measurement site at which an areal image slope is less than a predefined critical areal image slope.

4. The method of claim 1, wherein said predetermined criterion is whether said selected design clip has a perimeter to area ratio that is greater than a predefined critical perimeter to area ratio or whether said selected design clip includes a measurement site at which an areal image slope is less than a predefined critical areal image slope.

5. The method of claim 1, further comprising moving, for each selected design clip that is identified as including at least one measurement site satisfying said predetermined criterion, said marker layer to include all measurement sites within said selected design clip that satisfies said predetermined criterion.

6. The method of claim 1, further comprising generating a plurality of OPC programs including said OPC program and said at least another OPC program by comparing a critical dimension between an optical model prediction value and measured data corresponding to a plurality of combinations of dose and depth of focus conditions.

7. The method of claim 6, further comprising:
    generating said OPC program from a combination corresponding to a standard dose and depth of focus condition; and
    generating said at least another OPC program from at least another combination corresponding to at least one non-standard dose and depth of focus condition.

8. The method of claim 7, further comprising:
    generating an error mean and an error root-mean-square (RMS) between said optical model prediction value and said measured data for each of said plurality of combinations;
    identifying subsets of said plurality of combinations having an error mean having an absolute value that exceeds a predefined threshold error mean absolute value or an error RMS that exceeds a predefined threshold error RMS value; and
    classifying said subsets into categories having non-overlapping ranges for said error mean and said error RMS.

9. The method of claim 8, further comprising:
    generating different resist models for each of said categories; and
    constructing each of said at least another OPC program includes one of said resist models.

10. A method of performing optical proximity correction on a design layout, said method comprising:
    a first step of generating a map of a perimeter to area ratio for said design layout;
    a second step of sorting a plurality of design clips from said design layout into a plurality of bins, wherein each bin includes a non-overlapping range of values for said perimeter to area ratio;
    a third step of determining, for each bin selected from said plurality of bins, a threshold value for each of at least one layout complexity parameter for design clips within said selected bin, wherein said threshold value characterizes design clips in which bridging or pinching of design shapes is marginally absent, wherein said predetermined criterion includes whether said selected design clip has a perimeter to area ratio that is greater than a predefined critical perimeter to area ratio or a logical combination thereof;
    a fourth step of classifying, for each selected bin, design clips into first design clips that has, for each of said at least one layout complexity parameter, a value that represents less complexity than a corresponding threshold value, and into second design clips that include all other design clips than said first design clips; and a fifth step of performing OPC on said first design clips with a first OPC program and performing OPC on said second design clips with at least one second OPC program different from said OPC program, wherein at least one of said first, second, third, fourth, and fifth steps is performed employing a system configured for performing optical proximity correction on design layouts, said system comprising a computing means and a non-transitory machine-readable data storage medium, wherein said computing means comprises a processor and a memory that are configured to run an automated program comprising said at least one of said first, second, third, fourth, and fifth steps.

11. The method of claim 10, wherein said at least one layout complexity parameter comprises a statistical quantity derived from an areal image contrast of a corresponding design clip.

12. The method of claim 10, wherein said at least one design layout complexity parameter comprises an edge number density defined by a total number of edges in a corresponding design clip divided by a total area of said corresponding design clip.

13. The method of claim 10, wherein said at least one layout complexity parameter comprises:
   a statistical quantity derived from an areal image contrast of a corresponding design clip; and
   an edge number density defined by a total number of edges in a corresponding design clip divided by a total area of said corresponding design clip.

14. The method of claim 10, further comprising:
   generating said second design clips from said design layout, wherein each of said at least one design clip includes a subset of said design layout;
   assigning at least one measurement site to each of said second design clips;
   determining, for each selected design clip among said second design clips, whether said selected design clip satisfies a predetermined criterion for classifying said selected design clip as including at least one complex design feature;
   marking, for each selected design clip that is identified as satisfying said predetermined criterion, a region that satisfies said predetermined criterion with a marker layer; and
   performing OPC on regions not marked with said marker layer with an OPC program within said at least one second OPC program and performing OPC on regions marked with said marker layer with at least another OPC program within said at least one second OPC program that is different from said OPC program.

15. A method of identifying regions having different levels of design complexity, said method comprising:
   a first step of generating at least one design clip from said design layout, wherein each of said at least one design clip includes a subset of said design layout;
   a second step of assigning at least one measurement site to each of said at least one design clip;
   a third step of determining, for each selected design clip among said at least one design clip, whether said selected design clip satisfies a predetermined criterion, said predetermined criterion including at least one of whether said selected design clip has a perimeter to area ratio that is greater than a predefined critical perimeter to area ratio and whether said selected design clip includes a measurement site at which an areal image slope is less than a predefined critical areal image slope, said areal image slope being a magnitude of a two-dimensional gradient of areal image intensity that is measured for a simulated intensity distribution that corresponds to said selected design clip;
   a fourth step of marking, for each selected design clip that satisfies said criterion, each region that satisfies said predetermined criterion with a marker layer;
   a fifth step of classifying regions marked with said marker layer as a first set of regions, and regions not marked with said marker layer as a second set of regions; and
   a sixth step of storing data identifying at least one of said first set of regions and said second set of regions in a non-transitory machine-readable data storage medium;
   wherein at least one of said second, third, fourth, and fifth steps is performed employing a system configured for performing optical proximity correction on design layouts, said system comprising a computing means and a non-transitory machine-readable data storage medium, wherein said computing means comprises a processor and a memory that are configured to run an automated program comprising said at least one of said second, third, fourth, and fifth steps.

16. The method of claim 15, wherein said predetermined criterion includes one or a logical combination of:
   whether said selected design clip has a perimeter to area ratio that is greater than a predefined critical perimeter to area ratio; and
   whether said selected design clip includes a measurement site at which an areal image slope is less than a predefined critical areal image slope.

17. The method of claim 15, wherein said predetermined criterion is whether said selected design clip has a perimeter to area ratio that is greater than a predefined critical perimeter to area ratio or whether said selected design clip includes a measurement site at which an areal image slope is less than a predefined critical areal image slope.

18. A system for performing optical proximity correction on a design layout, said system comprising a computing means and a non-transitory machine-readable data storage medium, wherein said computing means comprises a processor and a memory that are configured to run a automated program comprising steps of:
   generating at least one design clip from said design layout, wherein each of said at least one design clip includes a subset of said design layout;
   assigning at least one measurement site to each of said at least one design clip;
   determining, for each selected design clip among said at least one design clip, whether said selected design clip satisfies a predetermined criterion for classifying said selected design clip as including at least one complex design feature, wherein said predetermined criterion includes one or a logical combination of whether said selected design clip has a perimeter to area ratio that is greater than a predefined critical perimeter to area ratio, and whether said selected design clip includes a measurement site at which an areal image slope is less than a predefined critical areal image slope, said areal image slope being a magnitude of a two-dimensional gradient of areal image intensity that is measured for a simulated intensity distribution that corresponds to said selected design clip;
   marking, for each selected design clip that is identified as satisfying said predetermined criterion, a region that satisfies said predetermined criterion with a marker layer;

performing OPC on regions not marked with said marker layer with an OPC program and performing OPC on regions marked with said marker layer with at least another OPC program different from said OPC program; and storing data representing results of said performance of OPC with said OPC program and said performance of OPC with said at least another OPC program in said non-transitory machine-readable data storage medium.

19. The system of claim 18, wherein said predetermined criterion in said automated program includes one or a logical combination of:

whether said selected design clip has a perimeter to area ratio that is greater than a predefined critical perimeter to area ratio; and whether said selected design clip includes a measurement site at which an areal image slope is less than a predefined critical areal image slope.

20. The system of claim 18, wherein said automated program further comprises a step of moving, for each selected design clip that is identified as including at least one measurement site satisfying said predetermined criterion, said marker layer to include all measurement sites within said selected design clip that satisfies said predetermined criterion.

21. The system of claim 18, wherein said automated program further comprises a step of generating a plurality of OPC programs including said OPC program and said at least another OPC program by comparing a critical dimension between an optical model prediction value and measured data corresponding to a plurality of combinations of dose and depth of focus conditions.

22. A system for performing optical proximity correction on a design layout, said system comprising a computing means and a non-transitory machine-readable data storage medium, wherein said computing means comprises a processor and a memory that are configured to run a automated program comprising steps of:

generating a map of a perimeter to area ratio for said design layout;

sorting a plurality of design clips from said design layout into a plurality of bins, wherein each bin includes a non-overlapping range of values for said perimeter to area ratio;

determining, for each bin selected from said plurality of bins, a threshold value for each of at least one layout complexity parameter for design clips within said selected bin, wherein said threshold value characterizes design clips in which bridging or pinching of design shapes is marginally absent; and classifying, for each selected bin, design clips into first design clips that has, for each of said at least one layout complexity parameter, a value that represents less complexity than a corresponding threshold value, and into second design clips that include all other design clips than said first design clips;

performing OPC on said first design clips with a first OPC program and performing OPC on said second design clips with at least one second OPC program different from said OPC program;

storing data representing results of said performance of OPC with said OPC program and said performance of OPC with said at least another OPC program in said non-transitory machine-readable data storage medium;

generating said second design clips from said design layout, wherein each of said at least one design clip includes a subset of said design layout;

assigning at least one measurement site to each of said second design clips;

determining, for each selected design clip among said second design clips, whether said selected design clip satisfies a predetermined criterion for classifying said selected design clip as including at least one complex design feature, wherein said predetermined criterion includes one or a logical combination of whether said selected design clip has a perimeter to area ratio that is greater than a predefined critical perimeter to area ratio, and whether said selected design clip includes a measurement site at which an areal image slope is less than a predefined critical areal image slope, said areal image slope being a magnitude of a two-dimensional gradient of areal image intensity that is measured for a simulated intensity distribution that corresponds to said selected design clip.

23. The system of claim 22, wherein said at least one layout complexity parameter comprises:

a statistical quantity derived from an areal image contrast of a corresponding design clip; and an edge number density defined by a total number of edges in a corresponding design clip divided by a total area of said corresponding design clip.

24. The system of claim 22, wherein said automated program is configured to further perform steps of:

marking, for each selected design clip that is identified as satisfying said predetermined criterion, a region that satisfies said predetermined criterion with a marker layer; and performing OPC on regions not marked with said marker layer with an OPC program within said at least one second OPC program and performing OPC on regions marked with said marker layer with at least another OPC program within said at least one second OPC program that is different from said OPC program.

* * * * *